US011315893B2

(12) United States Patent
Huang

(10) Patent No.: US 11,315,893 B2
(45) Date of Patent: Apr. 26, 2022

(54) SEMICONDUCTOR DEVICE WITH COMPOSITE CONNECTION STRUCTURE AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/829,698

(22) Filed: Mar. 25, 2020

(65) Prior Publication Data

US 2021/0305182 A1 Sep. 30, 2021

(51) Int. Cl.
*H01L 23/00* (2006.01)
*H01L 23/528* (2006.01)
(Continued)

(52) U.S. Cl.
CPC ............ *H01L 24/05* (2013.01); *H01L 23/528* (2013.01); *H01L 23/5226* (2013.01);
(Continued)

(58) Field of Classification Search
None
See application file for complete search history.

(56) References Cited

U.S. PATENT DOCUMENTS

2003/0001282 A1* 1/2003 Meynen ............ H01L 21/76831 257/777
2007/0141829 A1* 6/2007 Ramappa ............ H01L 21/7682 438/619

(Continued)

FOREIGN PATENT DOCUMENTS

TW 200713553 A 4/2007
TW 201436105 A 9/2014
(Continued)

OTHER PUBLICATIONS

Office Action and Search Report issued in TW110105786 dated Aug. 4, 2021, 6 pages.

*Primary Examiner* — Julio J Maldonado
*Assistant Examiner* — Lawrence C Tynes, Jr.
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a first insulating layer positioned above the substrate, a second insulating layer positioned above the first insulating layer, a plurality of first conductive features positioned in the first insulating layer and the second insulating layer, and an alleviation structure positioned between the first insulating layer and the second insulating layer. The alleviation structure includes a first connecting interlayer respectively electrically coupled to the plurality of first conductive features positioned in the first insulating layer and the second insulating layer, and a plurality of alleviation structures positioned between the plurality of first conductive features in the first insulating layer and the plurality of first conductive features in the second insulating layer, wherein a porosity of the plurality of alleviation structures is between about 25% and about 100%.

18 Claims, 39 Drawing Sheets

(51) Int. Cl.
*H01L 23/522* (2006.01)
*H01L 25/065* (2006.01)
*H01L 25/00* (2006.01)

(52) U.S. Cl.
CPC .............. *H01L 24/03* (2013.01); *H01L 24/08* (2013.01); *H01L 24/13* (2013.01); *H01L 25/0657* (2013.01); *H01L 25/50* (2013.01); *H01L 2224/0557* (2013.01); *H01L 2224/08146* (2013.01); *H01L 2224/13022* (2013.01); *H01L 2224/13024* (2013.01); *H01L 2224/80001* (2013.01); *H01L 2225/06541* (2013.01); *H01L 2225/06565* (2013.01)

(56) References Cited

U.S. PATENT DOCUMENTS

| | | | | |
|---|---|---|---|---|
| 2009/0093100 | A1* | 4/2009 | Xia | H01L 21/76885 438/421 |
| 2009/0200536 | A1* | 8/2009 | Van Schaijk | H01L 27/2481 257/4 |
| 2010/0007021 | A1* | 1/2010 | Choo | H01L 23/564 257/751 |
| 2010/0224966 | A1* | 9/2010 | Chen | H01L 23/3121 257/621 |
| 2011/0115073 | A1* | 5/2011 | Chen | H01L 24/05 257/737 |
| 2015/0262929 | A1* | 9/2015 | Hsiao | H01L 21/7685 257/773 |
| 2018/0366489 | A1* | 12/2018 | Harari | H01L 21/76802 |
| 2020/0006346 | A1* | 1/2020 | Avci | H01L 23/5223 |
| 2020/0028078 | A1* | 1/2020 | Ok | H01L 45/1293 |
| 2020/0266128 | A1* | 8/2020 | Chen | H01L 23/535 |
| 2020/0402942 | A1* | 12/2020 | Chen | H01L 24/94 |
| 2021/0257295 | A1* | 8/2021 | Chan | H01L 23/5226 |
| 2021/0305208 | A1* | 9/2021 | Huang | H01L 24/32 |

FOREIGN PATENT DOCUMENTS

| | | |
|---|---|---|
| TW | 201727859 A | 8/2017 |
| TW | 201911435 A | 3/2019 |
| TW | 201935642 A | 9/2019 |

* cited by examiner

SEMICONDUCTOR DEVICE WITH COMPOSITE CONNECTION STRUCTURE AND METHOD FOR FABRICATING THE SAME

TECHNICAL FIELD

The present disclosure relates to a semiconductor device and a method for fabricating the semiconductor device, and more particularly, to a semiconductor device with a composite connection structure and a method for fabricating the semiconductor device with the connection structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the demand for greater computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first semiconductor structure including a plurality of first conductive features adjacent to a top surface of the first semiconductor structure, a second semiconductor structure positioned above the first semiconductor structure and including a plurality of second conductive features adjacent to a bottom surface of the second semiconductor structure, and a connection structure positioned between the first semiconductor structure and the second semiconductor structure. The connection structure includes a connection layer electrically coupled to the plurality of first conductive features and the plurality of second conductive features, and a plurality of first porous interlayers positioned between the plurality of first conductive features and the plurality of second conductive features. A porosity of the plurality of first porous interlayers is between about 25% and about 100%.

In some embodiments, the semiconductor device includes a plurality of porous dielectric layers positioned on sidewalls and bottom surfaces of the plurality of first porous interlayers.

In some embodiments, the semiconductor device includes a connection insulating layer positioned between the first semiconductor structure and the connection structure, wherein the connection layer and the plurality of first porous interlayers are positioned in the connection insulating layer.

In some embodiments, the connection insulating layer includes a bottom insulating layer positioned on the top surface of the first semiconductor structure, a middle insulating layer positioned on the bottom insulating layer, and a top insulating layer positioned on the middle insulating layer.

In some embodiments, the plurality of first porous interlayers are positioned so as to penetrate the bottom insulating layer, the middle insulating layer, and the top insulating layer.

In some embodiments, the plurality of first porous interlayers have a thickness less than a thickness of the connection insulating layer.

In some embodiments, the semiconductor device includes a second porous interlayer positioned between the top insulating layer and the second semiconductor structure, wherein a porosity of the second porous interlayer is less than the porosity of the plurality of first porous interlayers.

In some embodiments, the porosity of the second porous interlayer is between about 25% and about 50%.

In some embodiments, the plurality of first porous interlayers have widths less than widths of the plurality of second conductive features.

In some embodiments, widths of the plurality of first conductive features are greater than the widths of the plurality of first porous interlayers.

In some embodiments, the connection structure includes a plurality of assistance layers positioned in the connection insulating layer, wherein the second semiconductor structure includes a plurality of guard rings positioned on the plurality of assistance layers.

Another aspect of the present disclosure provides a semiconductor device including a first substrate, a first insulating layer positioned above the first substrate, a second insulating layer positioned above the first insulating layer, a plurality of first conductive features positioned in the first insulating layer and the second insulating layer, and a alleviation structure positioned between the first insulating layer and the second insulating layer. The alleviation structure includes a first connecting interlayer respectively electrically coupled to the plurality of first conductive features positioned in the first insulating layer and the second insulating layer, and a plurality of first alleviation layers positioned between the plurality of first conductive features positioned in the first insulating layer and the plurality of first conductive features positioned in the second insulating layer. A porosity of the plurality of first alleviation layers is between about 25% and about 100%.

In some embodiments, the semiconductor device includes a plurality of porous dielectric layers positioned on sidewalls and bottom surfaces of the plurality of first alleviation layers.

In some embodiments, the semiconductor device includes a plurality of top porous dielectric layers positioned between the plurality of first alleviation layers and the plurality of first conductive features positioned in the second insulating layer.

Another aspect of the present disclosure provides a method for fabricating a semiconductor device including providing a first semiconductor structure including a plurality of first conductive features adjacent to a top surface of the first semiconductor structure; forming a connection structure including a connection insulating layer on the top surface of the first semiconductor structure, a connection layer in the connection insulating layer, and a plurality of first porous interlayers on the plurality of first conductive features and in the connection insulating layer; and forming a second semiconductor structure including a plurality of second conductive features on the plurality of first porous interlayers. A porosity of the plurality of first porous interlayers is between about 25% and about 100%. The connection insulating layer is electrically connected to the plurality of first conductive features and the plurality of second conductive features.

In some embodiments, the step of forming the connection structure includes: forming the connection insulating layer on the first semiconductor structure, forming a plurality of openings in the connection layer, forming a layer of energy-removable material in the plurality of openings, performing a planarization process until a top surface of the connection insulating layer is exposed, and performing an energy treatment to turn the layer of energy-removable material into the plurality of first porous interlayers.

In some embodiments, the layer of energy-removable material includes a base material and a decomposable porogen material.

In some embodiments, the base material includes methylsilsesquioxane, low-dielectric materials, or silicon oxide.

In some embodiments, an energy source of the energy treatment is heat, light, or a combination thereof.

In some embodiments, a portion of the layer of energy-removable material comprising the decomposable porogen material is greater than a portion of the layer of energy-removable material comprising the base material.

Due to the design of the semiconductor device of the present disclosure, multiple semiconductor devices may be connected together through the connection structure to provide a more sophisticated function while occupying less space. Therefore, the cost of the semiconductor device may be reduced, and the profitability of the semiconductor device may be increased. In addition, the plurality of first alleviation layers and the plurality of first porous interlayers may alleviate an interference effect between electrical signals induced in or applied to the first semiconductor structure and the semiconductor device.

The foregoing has outlined rather broadly the features and is technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
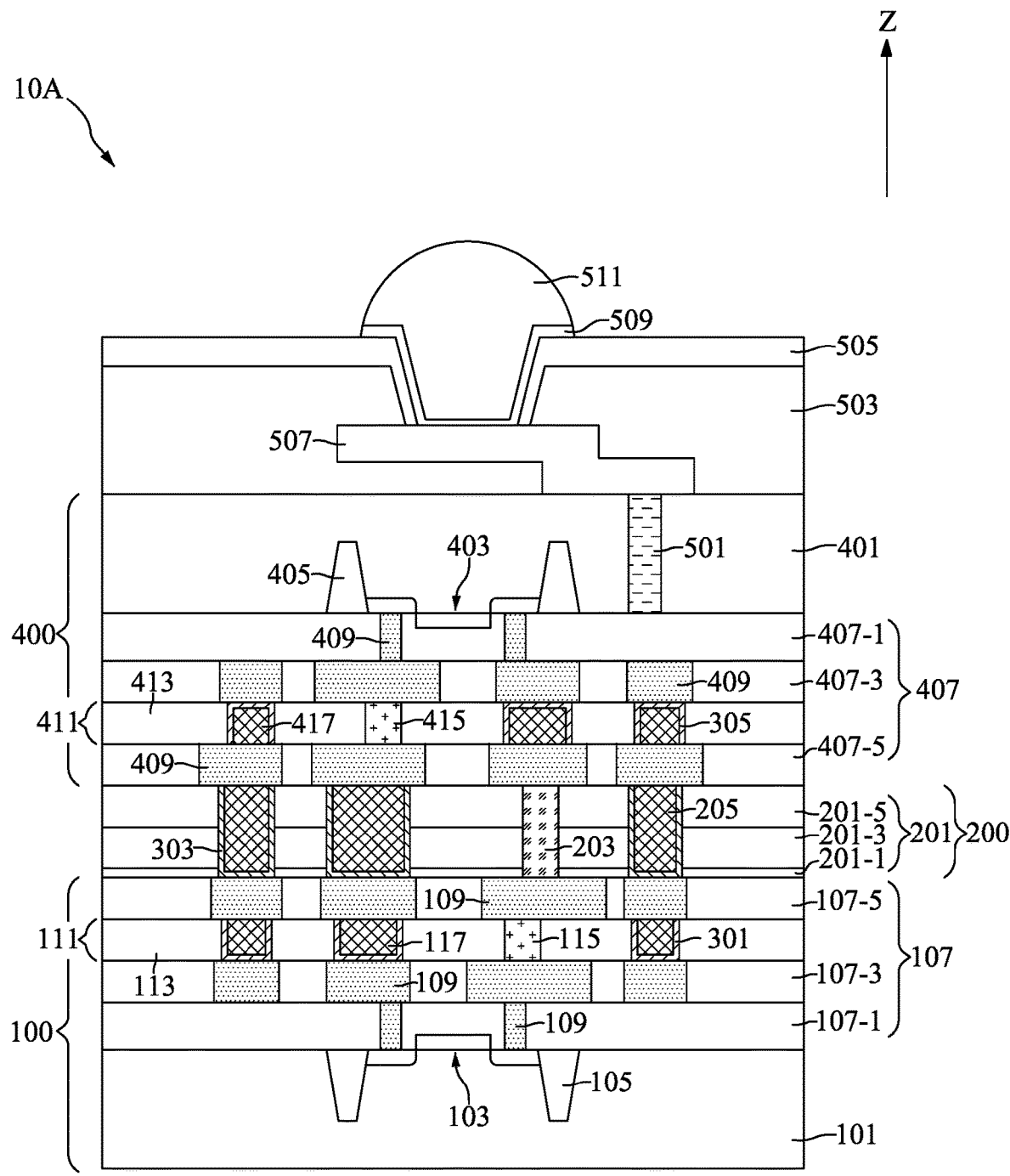
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that the term "about" modifying the quantity of an ingredient, component, or reactant of the present disclosure refers to variation in the numerical quantity that can occur, for example, through typical measuring and liquid-handling procedures used for making concentrates or solutions. Furthermore, variation can occur from inadvertent error in measuring procedures, differences in the manufacture, source, or purity of the ingredients employed to make the compositions or carry out the methods, or the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

Figure 2:
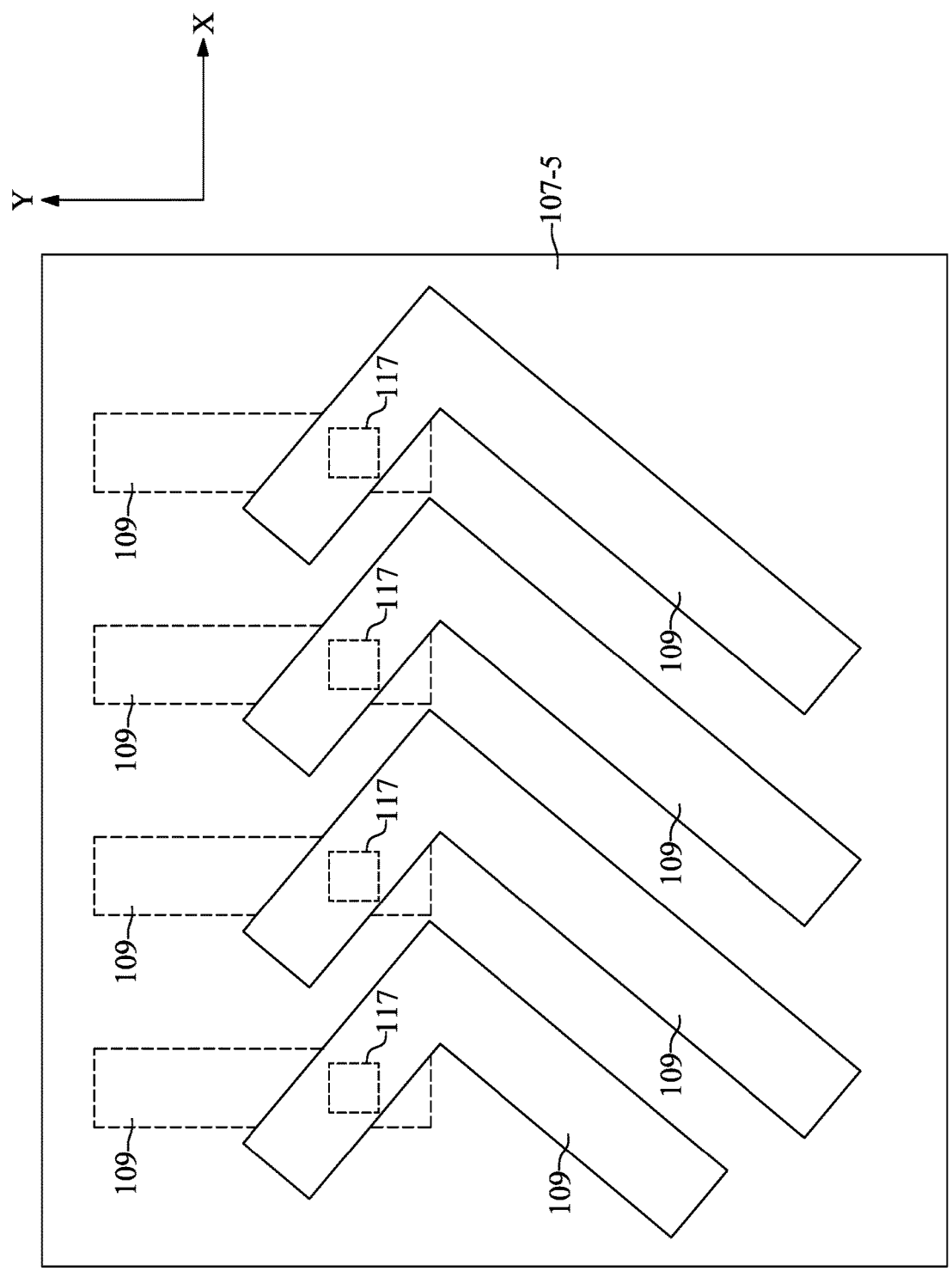
FIGS. 2 and 3 illustrate, in schematic top-view diagrams, a semiconductor device in accordance with one embodiment of the present disclosure.
Figure 3:
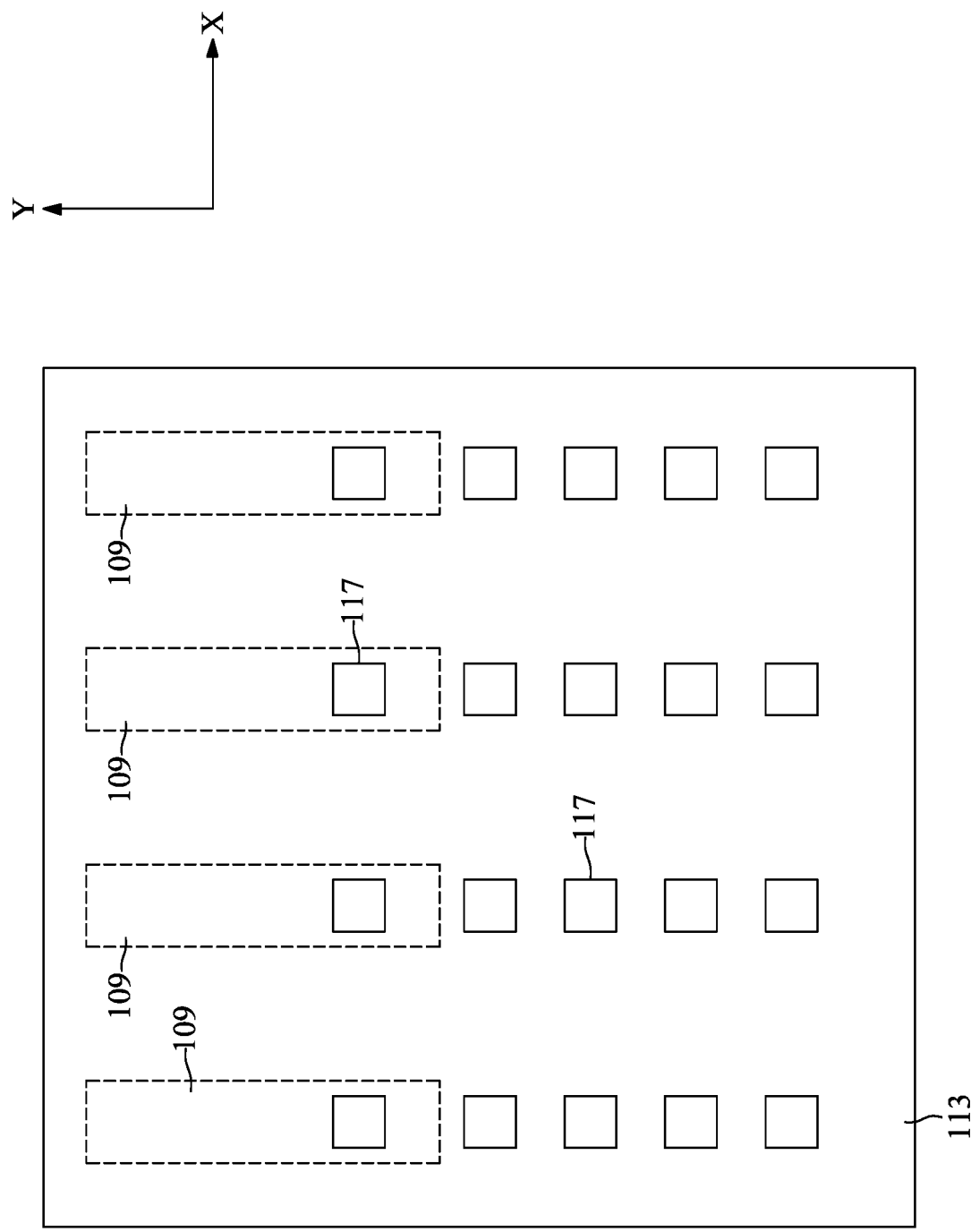

FIG. 1 illustrates, in a schematic cross-sectional diagram, a semiconductor device 10A in accordance with one embodiment of the present disclosure. FIGS. 2 and 3 illustrate, in schematic top-view diagrams, a semiconductor device in accordance with one embodiment of the present disclosure.

With reference to FIGS. 1 to 3, the semiconductor device 10A may include a first semiconductor structure 100, a first alleviation structure 111, a connection structure 200, a plurality of first porous dielectric layers 301, a plurality of second porous dielectric layers 303, a plurality of third porous dielectric layers 305, a second semiconductor structure 400, a second alleviation structure 411, a through substrate via 501, a bottom passivation layer 503, a top passivation layer 505, a redistribution layer 507, an under bump metallization layer 509, and a conductive bump 511.

With reference to FIGS. 1 to 3, the first semiconductor structure 100 may include a first substrate 101, a first device element 103, a first isolation layer 105, a first interconnection structure 107, and a plurality of first conductive features 109.

With reference to FIGS. 1 to 3, the first substrate 101 may be formed of, for example, silicon, silicon carbide, germanium silicon germanium, gallium arsenic, indium arsenide, indium, or other semiconductor materials including group III, group IV, and group V elements. In some embodiments, the first substrate 101 may include a silicon-on-insulator structure. For example, the first substrate 101 may include a buried oxide layer formed using a process such as separation by implanted oxygen.

With reference to FIGS. 1 to 3, the first device element 103 may be disposed in a lower portion of the first interconnection structure 107. In some embodiments, the first device element 103 may be disposed on the first substrate 101 (only one first device element 103 is shown in FIG. 1 for clarity). The first device element 103 may be, for example, bipolar junction transistor, metal-oxide-semiconductor field-effect transistor, diode, flash memory, dynamic random-access memory, static random-access memory, electrically erasable programmable read-only memory, image sensor, micro-electro-mechanical system, active device, or passive device. The first device element 103 may include a plurality of doped regions disposed in the first substrate 101. The plurality of doped regions may be doped with a dopant such as phosphorus, arsenic, antimony, or boron.

With reference to FIG. 1, the first isolation layer 105 may be disposed in the first substrate 101. The first isolation layer 105 may insulate the plurality of doped regions of the first device element 103 from neighboring doped regions. The first isolation layer 105 may be formed of, for example, an insulating material such as silicon oxide, silicon nitride, silicon oxynitride, silicon nitride oxide, fluoride-doped silicate, or the like. It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIGS. 1 to 3, the first interconnection structure 107 may be a composite connection structure disposed on the first substrate 101. The first interconnection structure 107 may include a first inter-dielectric layer 107-1, a first insulating layer 107-3, and a second insulating layer 107-5. The first inter-dielectric layer 107-1 may be disposed on the first substrate 101 and over the first device element 103. The first insulating layer 107-3 may be disposed on the first inter-dielectric layer 107-1. In the embodiment depicted, the second insulating layer 107-5 may be opposite to the first insulating layer 107-3 with the first alleviation structure 111 interposed therebetween. It should be noted that the number of layers of the first interconnection structure 107 is for illustration only, and more or fewer layers of the first interconnection structure 107 are also applicable. The first inter-dielectric layer 107-1, the first insulating layer 107-3, and the second insulating layer 107-5 have thicknesses between about 0.5 micrometers and about 3.0 micrometers. A top surface of the second insulating layer 107-5 may be referred to as a top surface of the first interconnection structure 107.

The first inter-dielectric layer 107-1, the first insulating layer 107-3, and the second insulating layer 107-5 may be formed of, for example, silicon oxide, borophosphosilicate glass, undoped silicate glass, fluorinated silicate glass, low-k dielectric materials, the like, or a combination thereof. The first inter-dielectric layer 107-1, the first insulating layer 107-3, and the second insulating layer 107-5 may be formed of different materials, but are not limited thereto. The low-k dielectric materials may have a dielectric constant less than 3.0 or even less than 2.5. In some embodiments, the low-k dielectric materials may have a dielectric constant less than 2.0.

With reference to FIGS. 1 to 3, the plurality of first conductive features 109 may be disposed in the first interconnection structure 107. Specifically, the plurality of first conductive features 109 may be disposed in the first inter-dielectric layer 107-1, the first insulating layer 107-3, and the second insulating layer 107-5. In the embodiment depicted, some of the plurality of first conductive features 109 may be disposed adjacent to the top surface of the first interconnection structure 107. The top surfaces of the some of the plurality of first conductive features 109 may be substantially coplanar with the top surface of the first interconnection structure 107. The plane consisting of the top surface of the first interconnection structure 107 and the top surfaces of the some of the plurality of first conductive features 109 may be referred to as the top surface of the first semiconductor structure 100.

In the embodiment depicted, from a top-view perspective, some of the plurality of first conductive features 109 disposed in the first insulating layer 107-3 and some the plurality of first conductive features 109 disposed in the second insulating layer 107-5 may be overlapping or partially overlapping. In other words, from a cross-sectional perspective, the some of the plurality of first conductive features 109 disposed in the second insulating layer 107-5 may be directly above the some of the plurality of first conductive features 109 disposed in the first insulating layer 107-3.

The plurality of first conductive features 109 may include, for example, conductive lines, conductive vias, and conductive contacts. The conductive via may connect adjacent conductive lines along the direction Z. The conductive vias may improve heat dissipation in the first interconnection structure 107 and provide structural support in first interconnection structure 107. The first device element 103 may be electrically coupled to the plurality of first conductive features 109.

The plurality of first conductive features 109 may be formed of, for example, copper, aluminum, titanium, the like, or a combination thereof. The conductive lines, the conductive vias, and the conductive contacts may be formed of different materials, but are not limited thereto.

With reference to FIGS. 1 to 3, the first alleviation structure 111 may be disposed between two adjacent insulating layers of the first interconnection structure 107; specifically, the first alleviation structure 111 may be disposed between the first insulating layer 107-3 and the second insulating layer 107-5. The first alleviation structure 111 may include a first alleviation insulating layer 113, a first connecting interlayer 115, and a plurality of first alleviation layers 117.

With reference to FIGS. 1 to 3, the first alleviation insulating layer 113 may be disposed between the first insulating layer 107-3 and the second insulating layer 107-5. The first alleviation insulating layer 113 may be formed of a same material as the first insulating layer 107-3, but is not limited thereto. The first connecting interlayer 115 may be disposed in the first alleviation insulating layer 113 and electrically coupled to one of the plurality of first conductive features 109 disposed in the second insulating layer 107-5 and one of the plurality of first conductive features 109 disposed in the first insulating layer 107-3. The first connecting interlayer 115 may be formed of a same material as the plurality of first conductive features 109, but is not limited thereto.

With reference to FIGS. 1 to 3, the plurality of first alleviation layers 117 may be disposed in the first alleviation insulating layer 113. The plurality of first alleviation layers 117 are disposed only in positions overlapped by the plurality of first conductive features 109 disposed in the second insulating layer 107-5 and the plurality of first conductive features 109 disposed in the first insulating layer 107-3. Widths of the plurality of first alleviation layers 117 may be less than widths of the plurality of first conductive features 109 disposed in the second insulating layer 107-5. The widths of the plurality of first alleviation layers 117 may be less than widths of the plurality of first conductive features 109 disposed in the first insulating layer 107-3.

The plurality of first alleviation layers 117 may be formed of an energy-removable material. Each of the plurality of first alleviation layers 117 may include a skeleton and a plurality of empty spaces disposed among the skeleton. The plurality of empty spaces may be connected to each other and may be filled with air. The skeleton may include, for example, silicon oxide, low-dielectric materials, or methylsilsesquioxane. Each of the plurality of first alleviation layers 117 may have a porosity between 25% and 100%. It should be noted that, when the porosity is 100%, it means the plurality of first alleviation layers 117 includes only empty spaces and the plurality of first alleviation layers 117 may be regarded as air gaps. In some embodiments, the porosity of the plurality of first alleviation layers 117 may be between 45% and 95%.

The plurality of empty spaces of the plurality of first alleviation layers 117 may be filled with air. As a result, a dielectric constant of the plurality of first alleviation layers 117 may be significantly lower than a dielectric constant of a layer formed of, for example, only silicon oxide. Therefore, the plurality of first alleviation layers 117 may significantly reduce the parasitic capacitance between the overlapping first conductive features 109. That is, the first alleviation structure 111 may significantly alleviate an interference effect between electrical signals induced in or applied to the first semiconductor structure 100.

The energy-removable material may include a material such as a thermally-decomposable material, a photonic-decomposable material, an e-beam decomposable material, or a combination thereof. For example, the energy-removable material may include a base material and a decomposable porogen material that is sacrificially removed upon being exposed to an energy source.

In some embodiments, the plurality of first alleviation layers 117 may be disposed in positions overlapped by the plurality of first conductive features 109, and may be disposed in other positions not overlapped by the plurality of first conductive features 109.

In some embodiments, the second insulating layer 107-5 may be opposite to the first insulating layer 107-3 with an insulating layer interposed between. That is, there is no first alleviation structure 111 disposed between the second insulating layer 107-5 and the first insulating layer 107-3. As a result, the parasitic capacitance of the overlapped first conductive features 109 may be greater.

With reference to FIGS. 1 to 3, the plurality of first porous dielectric layers 301 may be disposed on sidewalls and bottom surfaces of the plurality of first alleviation layers 117. In other words, the plurality of first porous dielectric layers 301 may be disposed between the first alleviation insulating layer 113 and the plurality of first alleviation layers 117, and between the plurality of first alleviation layers 117 and the plurality of first conductive features 109 disposed in the first insulating layer 107-3. In some embodiments, a dielectric constant of the plurality of first porous dielectric layers 301 may be less than 2.5.

With reference to FIG. 1, the second semiconductor structure 400 may be disposed opposite to the first semiconductor structure 100 with the connection structure 200 interposed therebetween. The first semiconductor structure 100 and the second semiconductor structure 400 may provide different functionalities. For example, the first semiconductor structure 100 may provide a logic function and the second semiconductor structure 400 may provide a memory function. In some embodiments, the first semiconductor structure 100 and the second semiconductor structure 400 may provide the same functionality.

With reference to FIG. 1, the second semiconductor structure 400 may have a structure similar to that of the first semiconductor structure 100. The second semiconductor structure 400 may include a second substrate 401, a second device element 403, a second isolation layer 405, a second interconnection structure 407, and a plurality of second conductive features 409.

With reference to FIG. 1, the second substrate 401 may be disposed opposite to the connection structure 200 with the second interconnection structure 407 interposed therebetween. The second substrate 401 has a structure similar to that of the first substrate 101, but is not limited thereto. The second substrate 401 may be formed of a same material as the first substrate 101, but is not limited thereto. In some embodiments, the second interconnection structure 407 is a composite connection structure, including a second inter-dielectric layer 407-1, a third insulating layer 407-3, and a fourth insulating layer 407-5. The second interconnection structure 407 may have a structure similar to that of the first interconnection structure 107, but is not limited thereto. A bottom surface of the fourth insulating layer 407-5 may be referred to as a bottom surface of the second interconnection structure 407.

With reference to FIG. 1, the second device element 403 may be disposed adjacent to an upper portion of the second inter-dielectric layer 407-1 (only one second device element 403 is shown in FIG. 1 for clarity). The second device element 403 may be, for example, a bipolar junction transistor, a metal-oxide-semiconductor field-effect transistor, a diode, a flash memory, a dynamic random-access memory, a static random-access memory, an electrically-erasable programmable read-only memory, an image sensor, a micro-electro-mechanical system, an active device, or a passive device. The second isolation layer 405 may be disposed in the second substrate 401 and may have a structure similar to that of the first isolation layer 105, but is not limited thereto. The second isolation layer 405 may be formed of a same material as the first isolation layer 105, but is not limited thereto.

With reference to FIG. 1, the plurality of second conductive features 409 may be disposed in the second interconnection structure 407. The plurality of second conductive features 409 may have structures similar to those of the plurality of first conductive features 109. In some embodiments, some of the plurality of second conductive features 409 may be disposed adjacent to the bottom surface of the second interconnection structure 407. Bottom surfaces of some of the plurality of second conductive features 409 and the bottom surface of the second interconnection structure 407 may be substantially coplanar. The plane consisting of the bottom surface of the second interconnection structure 407 and the bottom surfaces of the some of the plurality of second conductive features 409 may be referred to as the bottom surface of the second semiconductor structure 400.

Some of the plurality of second conductive features 409 disposed in the fourth insulating layer 407-5 and some of the plurality of first conductive features 109 disposed in the second insulating layer 107-5 may be overlapping or partially overlapping from a top-view perspective.

With reference to FIG. 1, the second alleviation structure 411 may include a second alleviation insulating layer 413, a second connecting interlayer 415, and a plurality of second alleviation layers 417. The second alleviation structure 411 may have a structure similar to that of the first alleviation structure 111. The second alleviation insulating layer 413 may disposed between the third insulating layer 407-3 and the fourth insulating layer 407-5. The second alleviation insulating layer 413 may be formed of a same material as the first alleviation insulating layer 113, but is not limited thereto. The second connecting interlayer 415 may be disposed in the second alleviation insulating layer 413 and electrically coupled to the plurality of second conductive features 409. The second connecting interlayer 415 may be formed of a same material as the first connecting interlayer 115, but is not limited thereto. The plurality of second alleviation layers 417 may be disposed in the second alleviation insulating layer 413.

The plurality of second alleviation layers 417 may be formed of a same energy-removable material as the plurality of first alleviation layers 117. The plurality of second alleviation layers 417 may significantly reduce the parasitic capacitance between overlapping second conductive features 409. That is, the second alleviation structure 411 may significantly alleviate an interference effect between electrical signals induced in or applied to the second semiconductor structure 400.

With reference to FIG. 1, the plurality of third porous dielectric layers 305 may be disposed on sidewalls and top surfaces of the plurality of second alleviation layers 417. In some embodiments, a dielectric constant of the plurality of third porous dielectric layers 305 may be less than 2.5.

With reference to FIG. 1, the connection structure 200 may be disposed on the first semiconductor structure 100. Specifically, the connection structure 200 may be disposed between the first semiconductor structure 100 and the second semiconductor structure 400. The connection structure 200 may include a connection insulating layer 201, a connection layer 203, and a plurality of first porous interlayers 205.

With reference to FIG. 1, the connection insulating layer 201 may be disposed between the first semiconductor structure 100 and the second semiconductor structure 400. The connection insulating layer 201 may be a multi-layer structure including a bottom insulating layer 201-1, a middle insulating layer 201-3, and a top insulating layer 201-5.

The bottom insulating layer 201-1 may be disposed on the top surface of the first semiconductor structure 100. A bottom surface of the bottom insulating layer 201-1 may be substantially coplanar with the top surface of the first semiconductor structure 100. The bottom insulating layer 201-1 may be an etch stop layer and may be formed of, for example, silicon nitride, silicon carbide, silicon oxide, low-k dielectric materials, extremely low-k dielectric materials, the like, or a combination thereof. The low-k dielectric materials may be, for example, carbon doped oxides. The extremely low-k dielectric materials may be, for example, porous carbon doped silicon oxide.

The middle insulating layer 201-3 may be disposed on the bottom insulating layer 201-1. The top insulating layer 201-5 may be disposed on the middle insulating layer 201-3. A top surface of the top insulating layer 201-5 may be substantially coplanar with a bottom surface of the second semiconductor structure 400. The middle insulating layer 201-3 and the top insulating layer 201-5 may be formed of, for example, silicon oxide, silicon oxynitride, silicon nitride, borosilicate glass, borophosphosilicate glass, phosphoric silicate glass, fluorinated silicate glass, low-k dielectric materials, or a combination thereof. The middle insulating layer 201-3 and the top insulating layer 201-5 may be formed of different materials, but are not limited thereto.

With reference to FIG. 1, the connection layer 203 may be disposed so as to penetrate the top insulating layer 201-5, the middle insulating layer 201-3, and the bottom insulating layer 201-1. The connection layer 203 may be electrically coupled to one of the plurality of first conductive features 109 disposed in the second insulating layer 107-5 and one of the plurality of second conductive features 409 disposed in the fourth insulating layer 407-5. The plurality of first porous interlayers 205 may be formed of, for example, copper, aluminum, titanium, tungsten, cobalt, the like, or a combination thereof.

With reference to FIG. 1, the plurality of first porous interlayers 205 may be disposed in the connection insulating layer 201. In the embodiment depicted, the plurality of first porous interlayers 205 may be disposed so as to penetrate the top insulating layer 201-5, the middle insulating layer 201-3, and the bottom insulating layer 201-1. In other words, thicknesses of the plurality of first porous interlayers 205 may be equal to a thickness of the connection insulating layer 201. In the embodiment depicted, the plurality of first porous interlayers 205 may be disposed in positions overlapped by the plurality of second conductive features 409 disposed in the fourth insulating layer 407-5, and may be disposed in positions overlapped by the plurality of first conductive features 109 disposed in the second insulating layer 107-5. Widths of the plurality of first porous interlayers 205 may be less than the widths of the plurality of first conductive features 109 disposed in the second insulating layer 107-5. The widths of the plurality of first porous interlayers 205 may be less than the widths of the plurality of second conductive features 409 disposed in the fourth insulating layer 407-5.

The plurality of first porous interlayers 205 may be formed of a same energy-removable material as the plurality of first alleviation layers 117. Each of the plurality of first porous interlayers 205 may include a skeleton and a plurality of empty spaces disposed among the skeleton. The plurality of empty spaces may be connected to each other and may be filled with air. The skeleton may include, for example, silicon oxide, low-dielectric materials, or methylsilsesquioxane. Each of the plurality of first porous interlayers 205 may have a porosity between 25% and 100%. It should be noted that, when the porosity is 100%, it means the plurality of first porous interlayers 205 includes only empty spaces and the plurality of first porous interlayers 205 may be regarded as air gaps. In some embodiments, the porosity of the plurality of first porous interlayers 205 may be between 45% and 95%.

The plurality of empty spaces of the plurality of first porous interlayers 205 may be filled with air. As a result, a dielectric constant of the plurality of first porous interlayers 205 may be significantly lower than a dielectric constant of a layer formed of, for example, only silicon oxide. Therefore, the plurality of first porous interlayers 205 may significantly reduce the parasitic capacitance between overlapping first conductive features 109 and second conductive features 409. That is, the connection structure 200 with the plurality of first porous interlayers 205 may significantly alleviate an interference effect between electrical signals induced in or applied to the semiconductor device 10A.

With reference to FIG. 1, the plurality of second porous dielectric layers 303 may be disposed on sidewalls and bottom surfaces of the plurality of first porous interlayers 205. In some embodiments, a dielectric constant of the plurality of second porous dielectric layers 303 may be less than 2.5.

With reference to FIG. 1, the through substrate via 501 may be disposed in the second substrate 401 and may be electrically connected to one of the plurality of second conductive features 409 or the second device element 403. In some embodiments, the through substrate via 501 may be electrically connected to one of the plurality of first conductive features 109 of the first semiconductor structure 100 through some of the plurality of second conductive features 409. In some embodiments, the through substrate via 501 may be electrically connected to the connection layer 203 through some of the plurality of second conductive features 409. In some embodiments, the through substrate via 501 does not penetrate through the fourth insulating layer 407-5. In some embodiments, the through substrate via 501 does not occupy excessive space of the second semiconductor structure 400. Therefore, more second device elements 403 may be disposed in the second semiconductor structure 400 to provide a more sophisticated functional semiconductor device. The through substrate via 501 may be formed of, for example, copper, aluminum, titanium, the like, or a combination thereof.

With reference to FIG. 1, the bottom passivation layer 503 may be disposed on the second substrate 401. The top passivation layer 505 may be disposed on the bottom passivation layer 503. The redistribution layer 507 may be disposed in the bottom passivation layer 503. A portion of the bottom passivation layer 503 and a portion of the top passivation layer 505 may be recessed to expose a portion of a top surface of the redistribution layer 507. The bottom passivation layer 503 and the top passivation layer 505 may be formed of, for example, silicon nitride, silicon oxynitride, silicon oxide nitride, polyimide, polybenzoxazole, or a combination thereof. The bottom passivation layer 503 and the top passivation layer 505 may be formed of different materials, but are not limited thereto. The redistribution layer 507 may be electrically connected to the through substrate via 501. The redistribution layer 507 may be formed of, for example, tungsten, titanium, tin, nickel, copper, gold, aluminum, platinum, cobalt, or a combination thereof.

With reference to FIG. 1, the under bump metallization layer 509 may be disposed on the top passivation layer 505 and the portion of the top surface of the redistribution layer 507. The conductive bump 511 may be disposed on the under bump metallization layer 509 and electrically connected to the redistribution layer 507. The under bump metallization layer 509 may be formed of, for example, chromium, tungsten, titanium, copper, nickel, aluminum, palladium, gold, vanadium, or a combination thereof. The conductive bump 511 may be a solder bump.

The under bump metallization layer 509 may be a single-layer structure or a stacked structure of multiple layers. For example, the under bump metallization layer 509 may include a first metal layer, a second metal layer, and a third metal layer stacked sequentially. The first metal layer may serve as an adhesive layer for stably attaching the under bump metallization layer 509 to the redistribution layer 507 and the top passivation layer 505. For example, the first metal layer may include at least one of titanium, titanium-tungsten, chromium, and aluminum. The second metal layer may serve as a barrier layer for preventing a conductive material contained in the conductive bump 511 from diffusing into the redistribution layer 507 or into the top passivation layer 505. The second metal layer may include at least one of copper, nickel, chromium-copper, and nickel-vanadium. The third metal layer may serve as a seed layer for forming the conductive bump 511 or as a wetting layer for improving wetting characteristics of the conductive bump 511. The third metal layer may include at least one of nickel, copper, and aluminum.

FIGS. 4 to 10 illustrate, in schematic cross-sectional diagrams, semiconductor devices 10B, 10C, 10D, 10E, 10F, 10G, and 10H in accordance with embodiments of the present disclosure.

Figure 4:
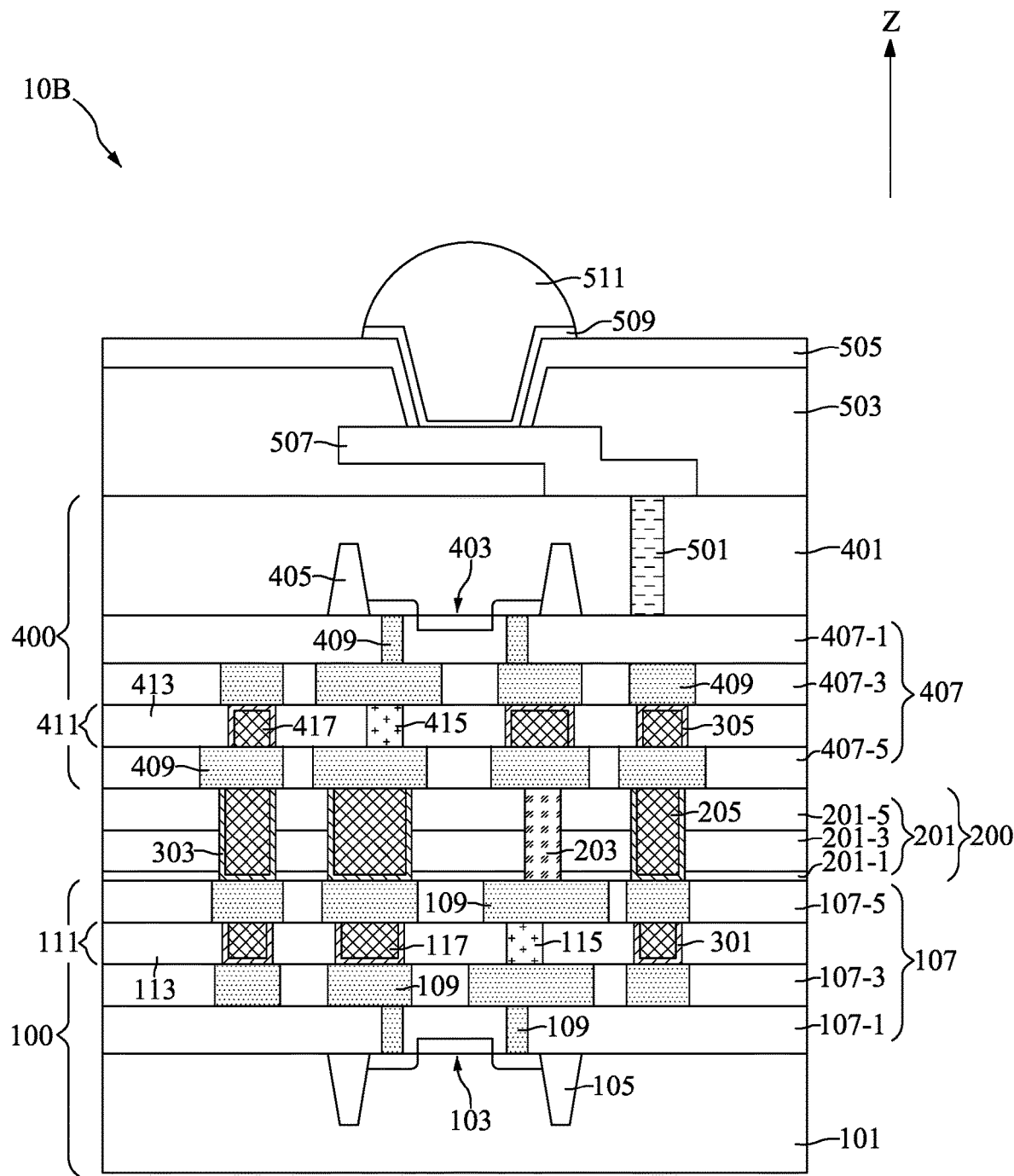
FIGS. 4 to 10 illustrate, in schematic cross-sectional diagrams, semiconductor devices in accordance with embodiments of the present disclosure.

With reference to FIG. 4, in the semiconductor device 10B, the plurality of first porous interlayers 205 are disposed so as to penetrate only the top insulating layer 201-5 and the middle insulating layer 201-3. In other words, the thicknesses of the plurality of first porous interlayers 205 may be less than the thickness of the connection insulating layer 201.

Figure 5:
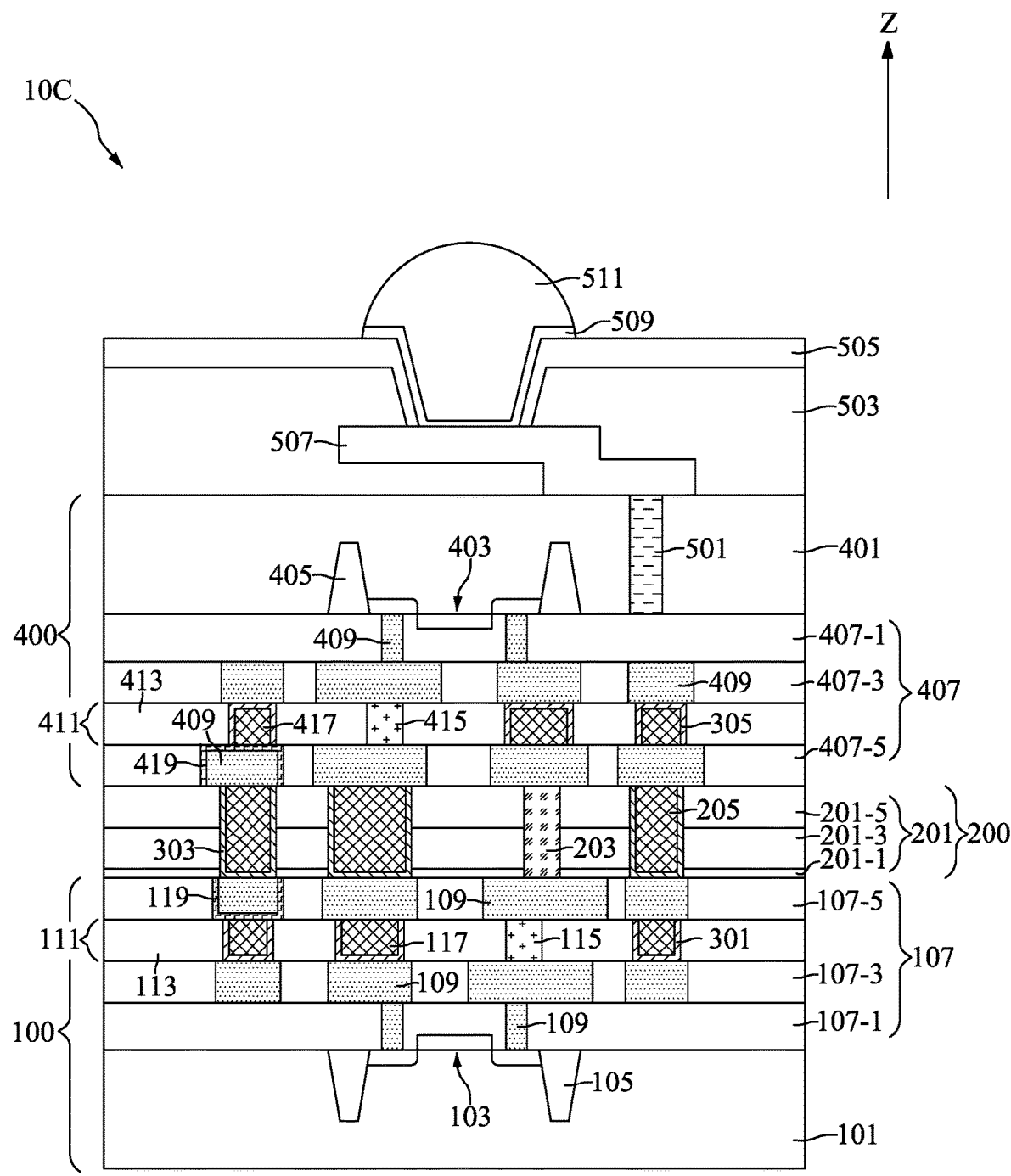

With reference to FIG. 5, in the semiconductor device 10C, a plurality of first barrier layers 119 may be disposed on sidewalls and bottom surfaces of the plurality of first conductive features 109 (only one first barrier layer 119 is shown in FIG. 5 for clarity). A plurality of second barrier layers 419 may be disposed on sidewalls and top surfaces of the plurality of second conductive features 409 (only one second barrier layer 419 is shown in FIG. 5 for clarity). The plurality of first barrier layers 119 and the plurality of second barrier layers 419 may be formed of, for example, titanium nitride, tantalum nitride, titanium, tantalum, titanium tungsten, the like, or a combination thereof.

Figure 6:
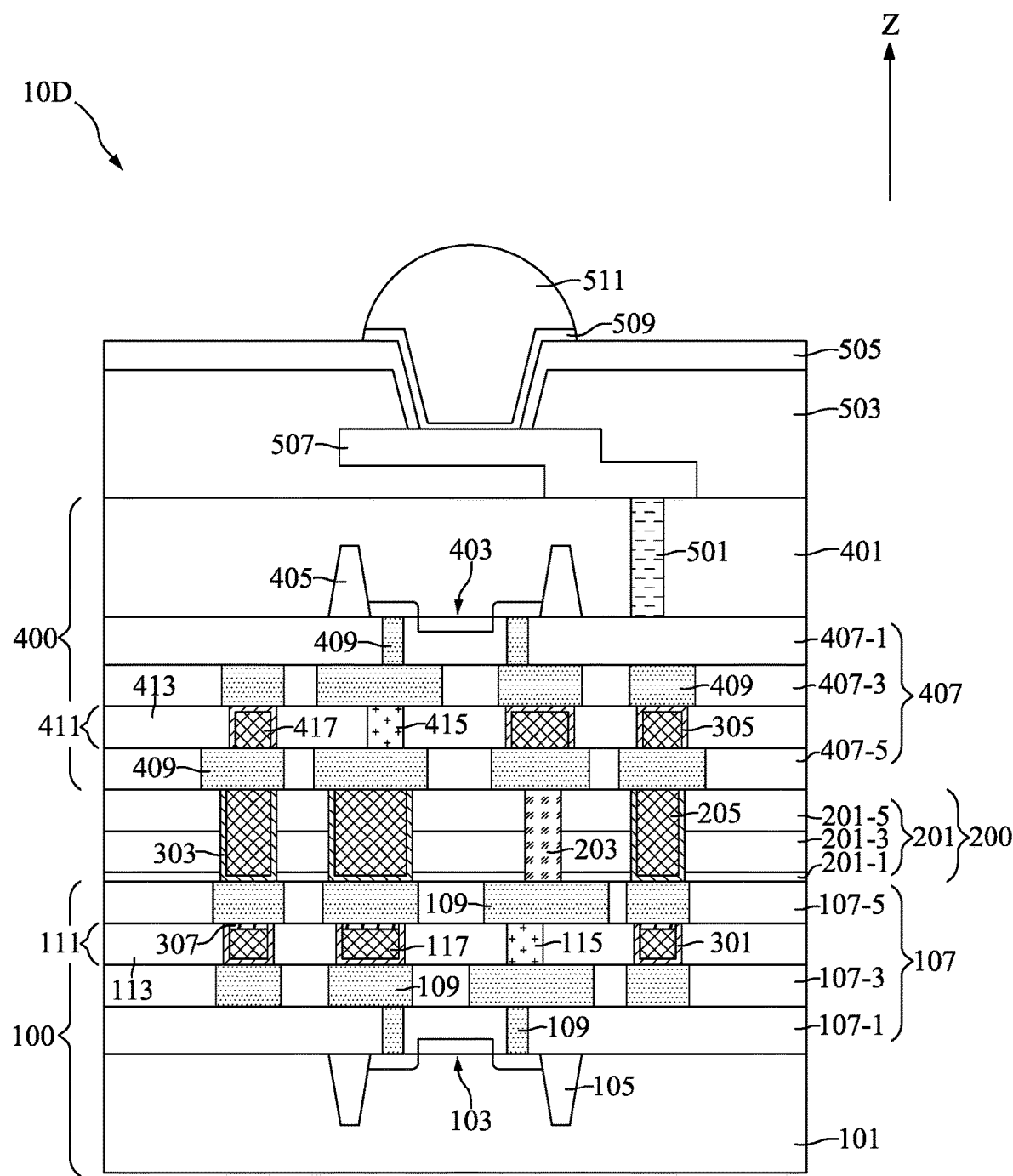

With reference to FIG. 6, in the semiconductor device 10D, a plurality of first top porous dielectric layers 307 may be disposed between the plurality of first alleviation layers 117 and the plurality of first conductive features 109 disposed in the second insulating layer 107-5. A dielectric constant of the plurality of first top porous dielectric layers 307 may be less than 2.5.

Figure 7:
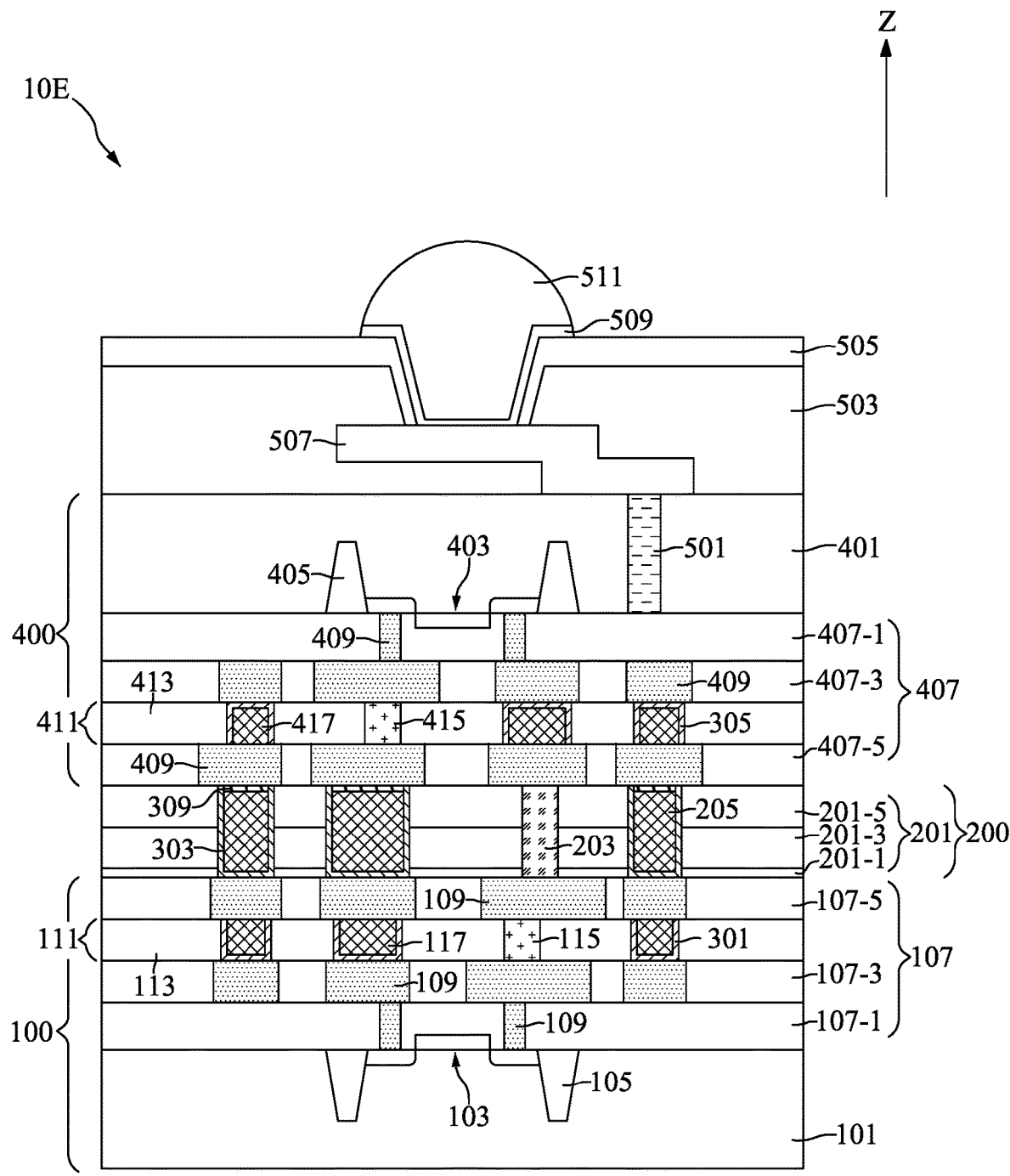

With reference to FIG. 7, in the semiconductor device 10E, a plurality of second top porous dielectric layers 309 may be disposed between the plurality of first porous interlayers 205 and the plurality of second conductive features 409 disposed in the fourth insulating layer 407-5. A dielectric constant of the plurality of second top porous dielectric layers 309 may be less than 2.5.

Figure 8:
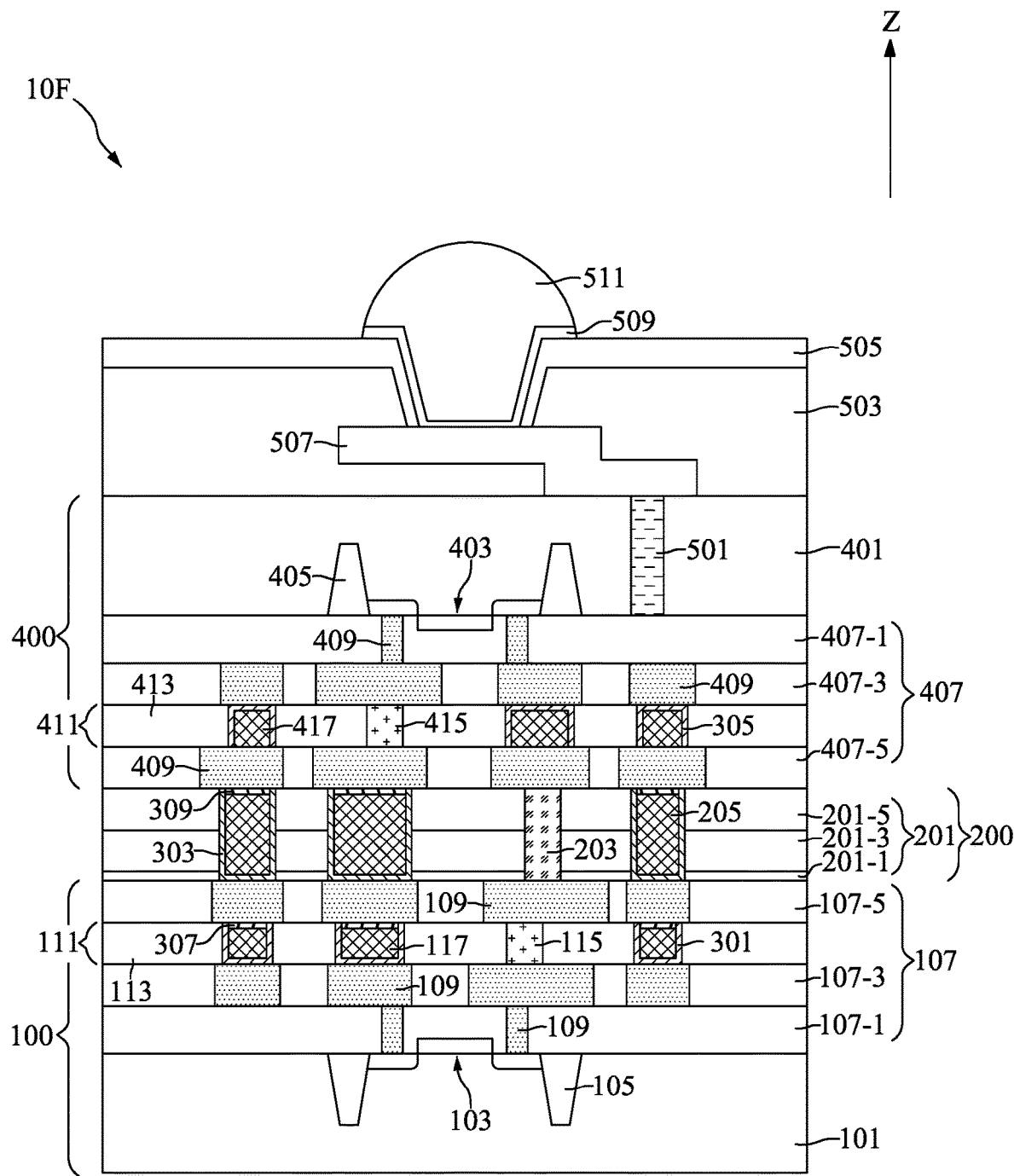

With reference to FIG. 8, in the semiconductor device 10F, the plurality of first top porous dielectric layers 307 may be disposed between the plurality of first alleviation layers 117 and the plurality of first conductive features 109 disposed in the second insulating layer 107-5. The dielectric constant of the plurality of first top porous dielectric layers 307 may be less than 2.5. The plurality of second top porous dielectric layers 309 may be disposed between the plurality of first porous interlayers 205 and the plurality of second conductive features 409 disposed in the fourth insulating layer 407-5. The dielectric constant of the plurality of second top porous dielectric layers 309 may be less than 2.5.

Figure 9:
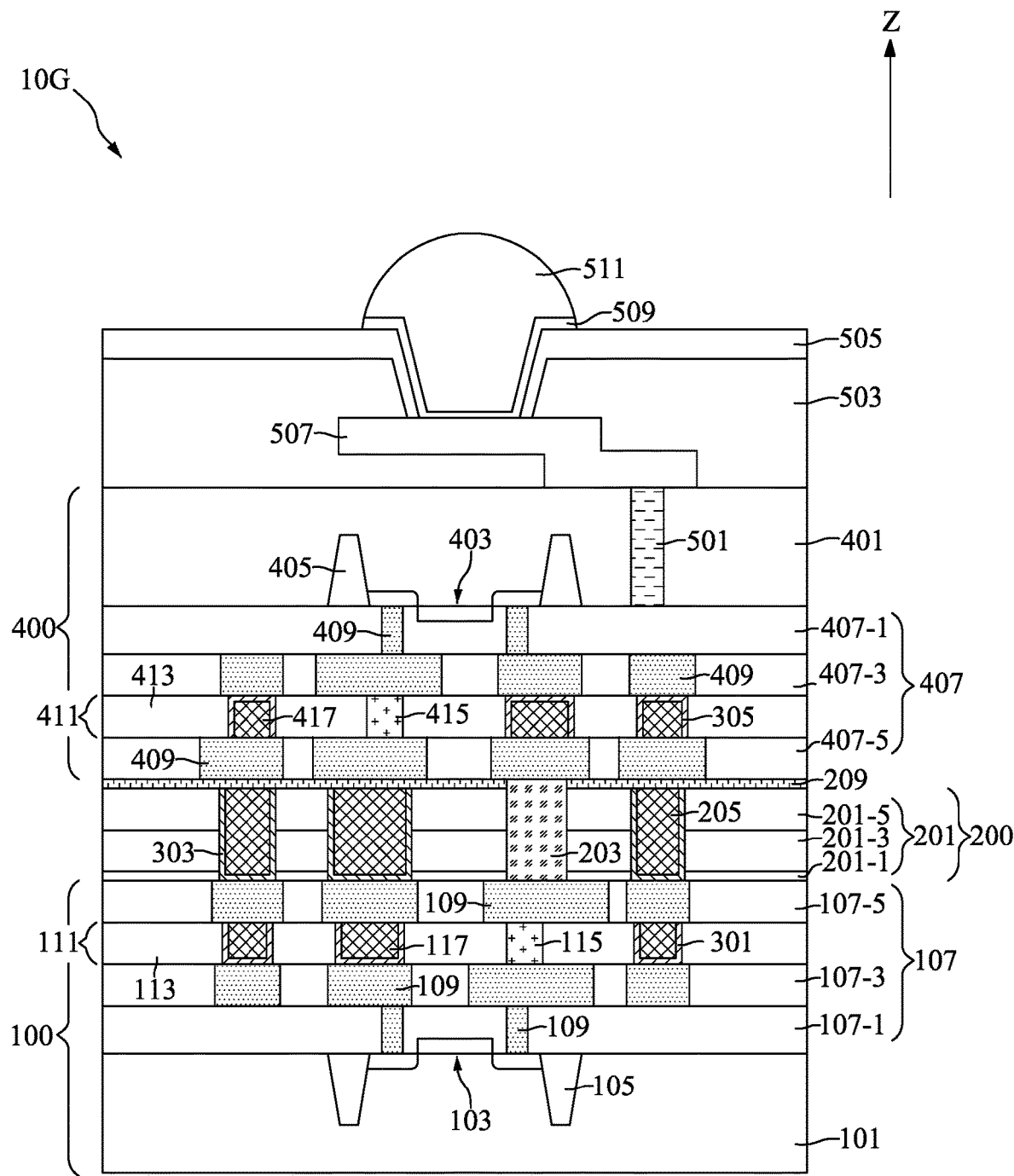

With reference to FIG. 9, in the semiconductor device 10G, a second porous interlayer 209 may be disposed between the connection insulating layer 201 and the second interconnection structure 407. Specifically, the second porous interlayer 209 may be disposed between the fourth insulating layer 407-5 and the top insulating layer 201-5. The second porous interlayer 209 may be formed of a same energy-removable material as the plurality of first porous interlayers 205. The second porous interlayer 209 may have a porosity less than that of the plurality of first porous interlayers 205. Specifically, the porosity of the second porous interlayer 209 may be between about 25% and about 50%.

Figure 10:
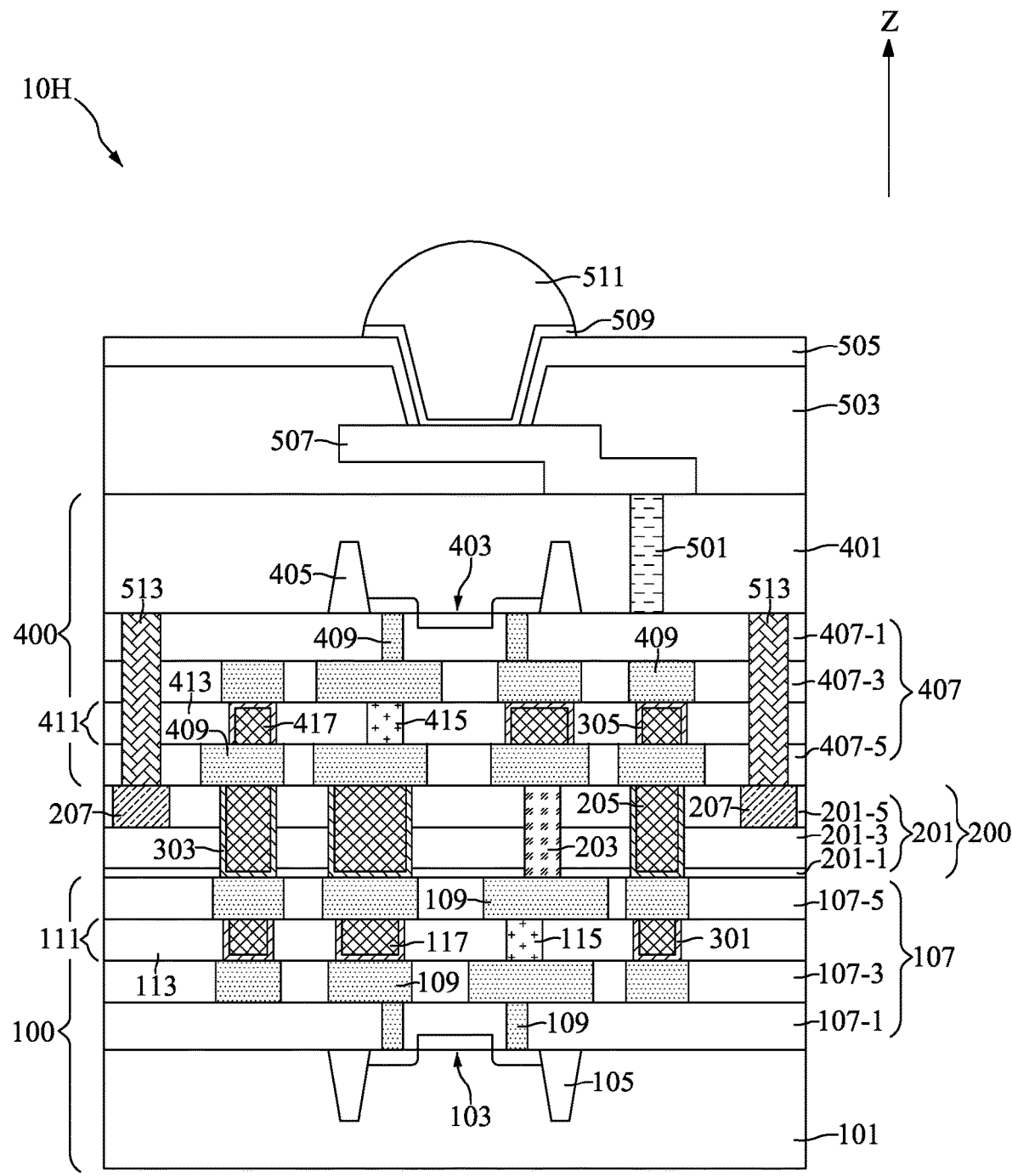

With reference to FIG. 10, in the semiconductor device 10H, the second semiconductor structure 400 may include a plurality of guard rings 513. The plurality of guard rings 513 may consist of some of the plurality of second conductive features 409 electrically connected to each other. The plurality of guard rings 513 may be dummy patterns. The plurality of guard rings 313 may penetrate, along the direction Z, the second interconnection structure 407 and the second alleviation insulating layer 413. The plurality of guard rings 513 may facilitate the planarization process during the formation of the plurality of second conductive features 409. The plurality of guard rings 513 may also facilitate a bonding process with another structure such as the connection structure 200. Furthermore, the plurality of guard rings 513 may improve the mechanical strength of the second semiconductor structure 400. In some embodiments, the plurality of guard rings 513 may consist of some of the plurality of second conductive features 409 disposed along the direction Z and apart from each other.

It should be noted that referring to an element as a "dummy" element means that the element is electrically insulated from all of the device elements. In addition, when the semiconductor device is in operation, no exterior voltage or current is applied to the element.

With reference to FIG. 10, the connection structure 200 may include a plurality of assistance layers 207. In some embodiments, the plurality of assistance layers 207 may be respectively correspondingly disposed below the plurality of guard rings 513 so as to penetrate the top insulating layer 201-5. In some embodiments, the plurality of first supporting layers 217 may be disposed so as to penetrate the top insulating layer 201-5, the middle insulating layer 201-3, and the bottom insulating layer 201-1. The plurality of assistance layers 207 may facilitate a bonding process with the second semiconductor structure 400.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 11:
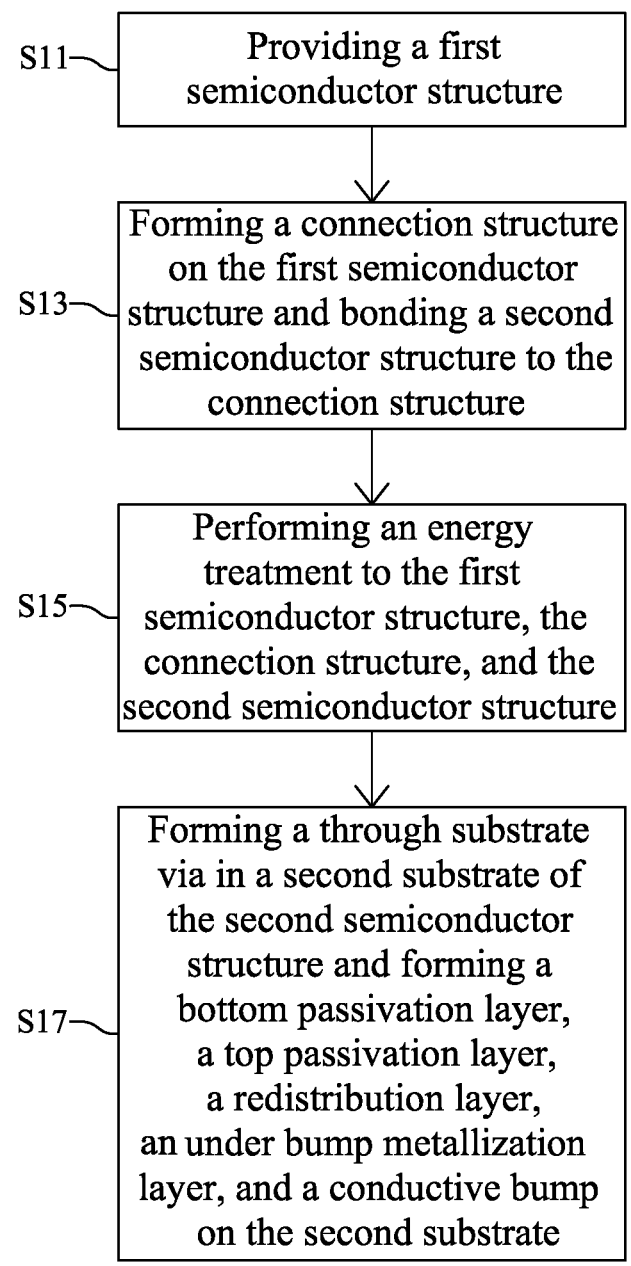
FIG. 11 illustrates, in a flowchart diagram form, a method for fabricating a semiconductor device in accordance with one embodiment of the present disclosure.

FIG. 11 illustrates, in a flowchart diagram form, a method 20 for fabricating a semiconductor device 10A in accordance with one embodiment of the present disclosure. FIGS. 12 to 26 illustrate, in schematic cross-sectional view diagrams, a flow for fabricating the semiconductor device in accordance with one embodiment of the present disclosure.

Figure 12:
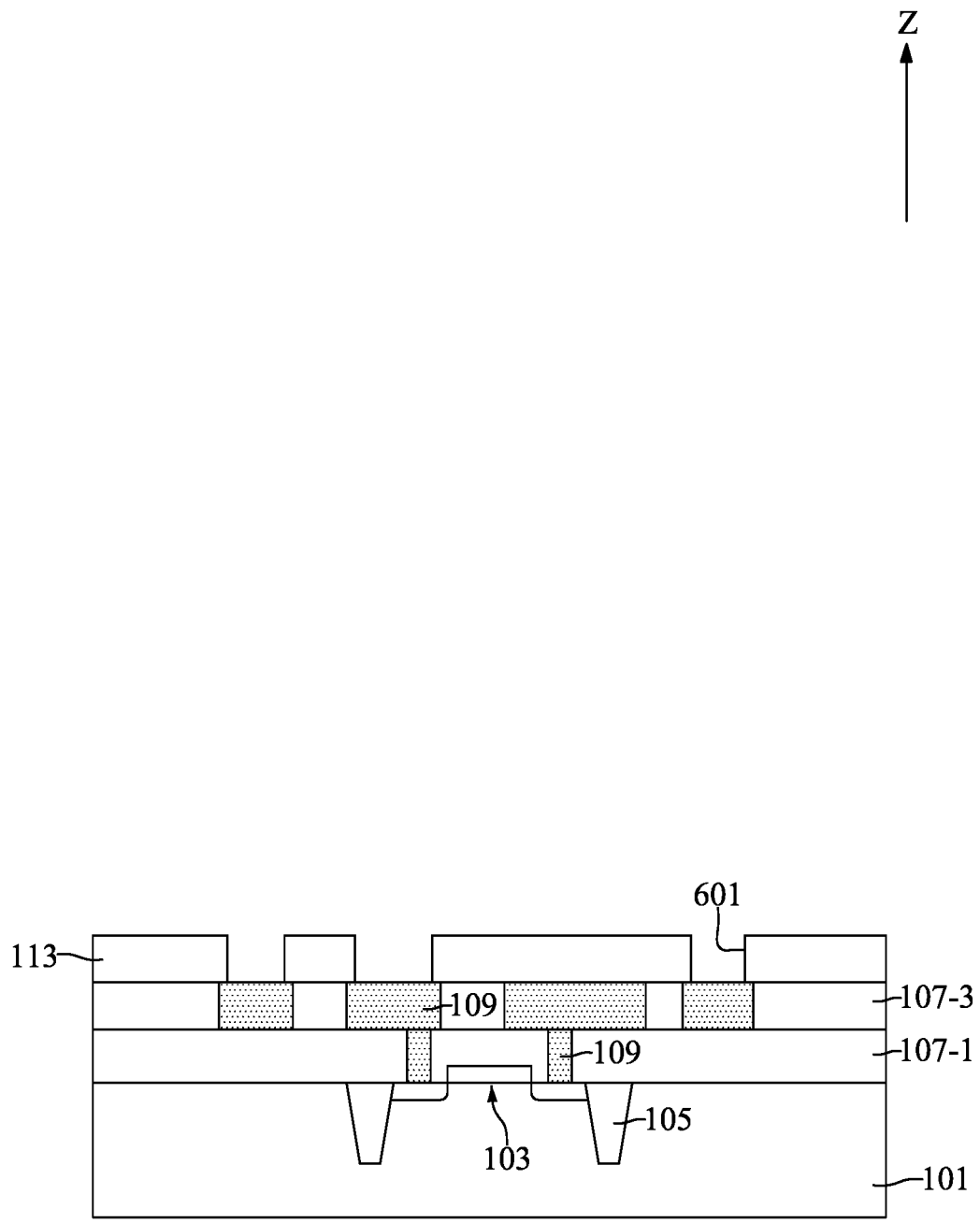
FIGS. 12 to 26 illustrate, in schematic cross-sectional view diagrams, a flow for fabricating the semiconductor device in accordance with one embodiment of the present disclosure.

With reference to FIG. 11 and FIGS. 12 to 17, at step S11, a first semiconductor structure 100 may be provided. The first semiconductor structure 100 may include a first substrate 101, a first device element 103, a first isolation layer 105, a first interconnection structure 107, and a plurality of first conductive features 109. With reference to FIG. 12, the first substrate 101 may be provided. The first isolation layer 105 may be formed in the first substrate 101. The first device element 103 may be formed on the first substrate 101. A first inter-dielectric layer 107-1 may be formed on the first substrate 101 and over the first device element 103. A first insulating layer 107-3 may be formed on the first inter-dielectric layer 107-1. Some of the plurality of first conductive features 109, such as conductive lines and conductive contacts, may be formed in the first insulating layer 107-3 and the first inter-dielectric layer 107-1. The first device element 103 may be electrically connected to the plurality of first conductive features 109.

With reference to FIG. 12, a first alleviation insulating layer 113 may be formed on the first insulating layer 107-3. A photolithography-etch process may be performed to form a plurality of first openings 601 in the first alleviation insulating layer 113. Portions of the top surfaces of some of the plurality of first conductive features 109 in the first insulating layer 107-3 may be exposed through the plurality of first openings 601.

Figure 13:
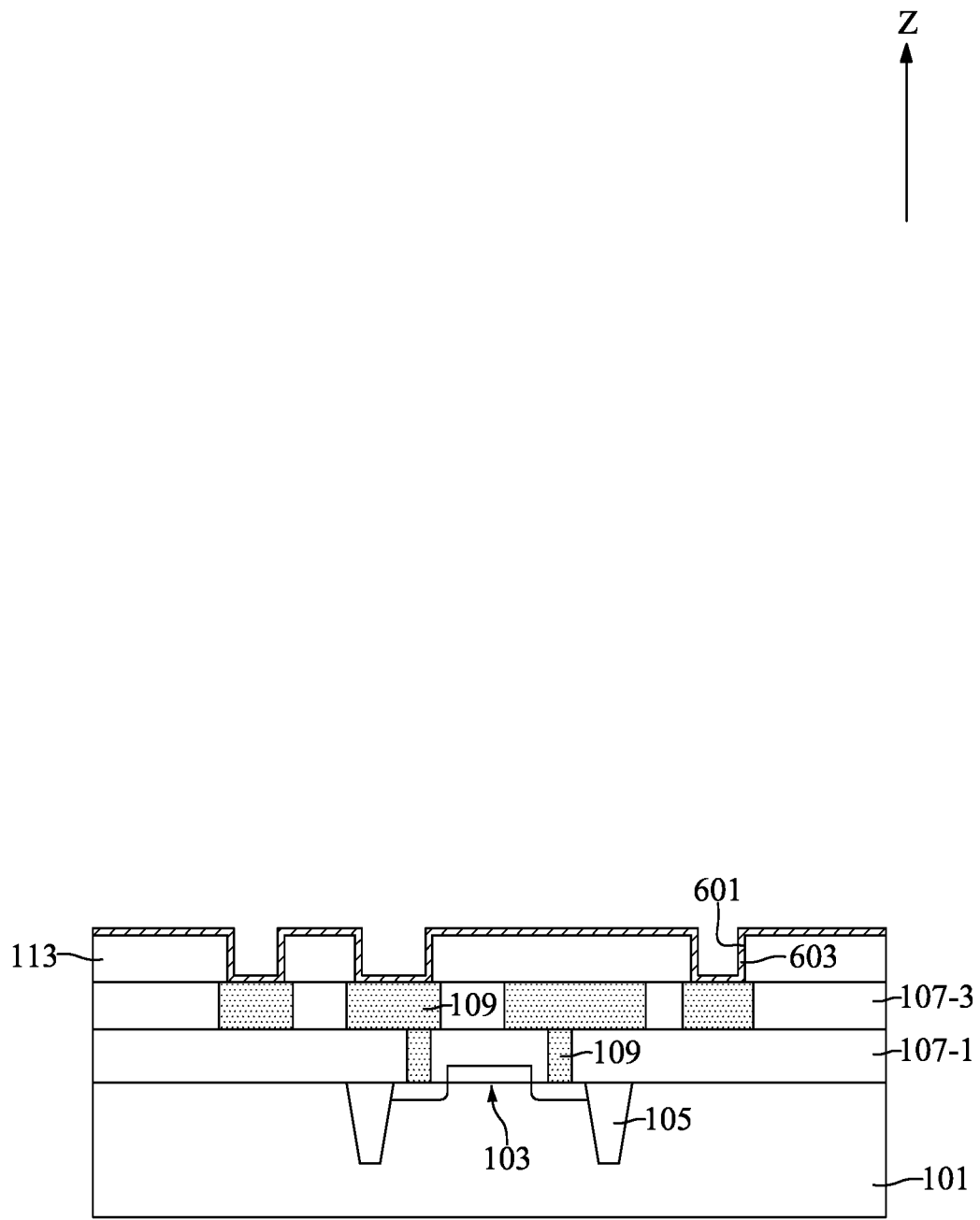
Figure 14:
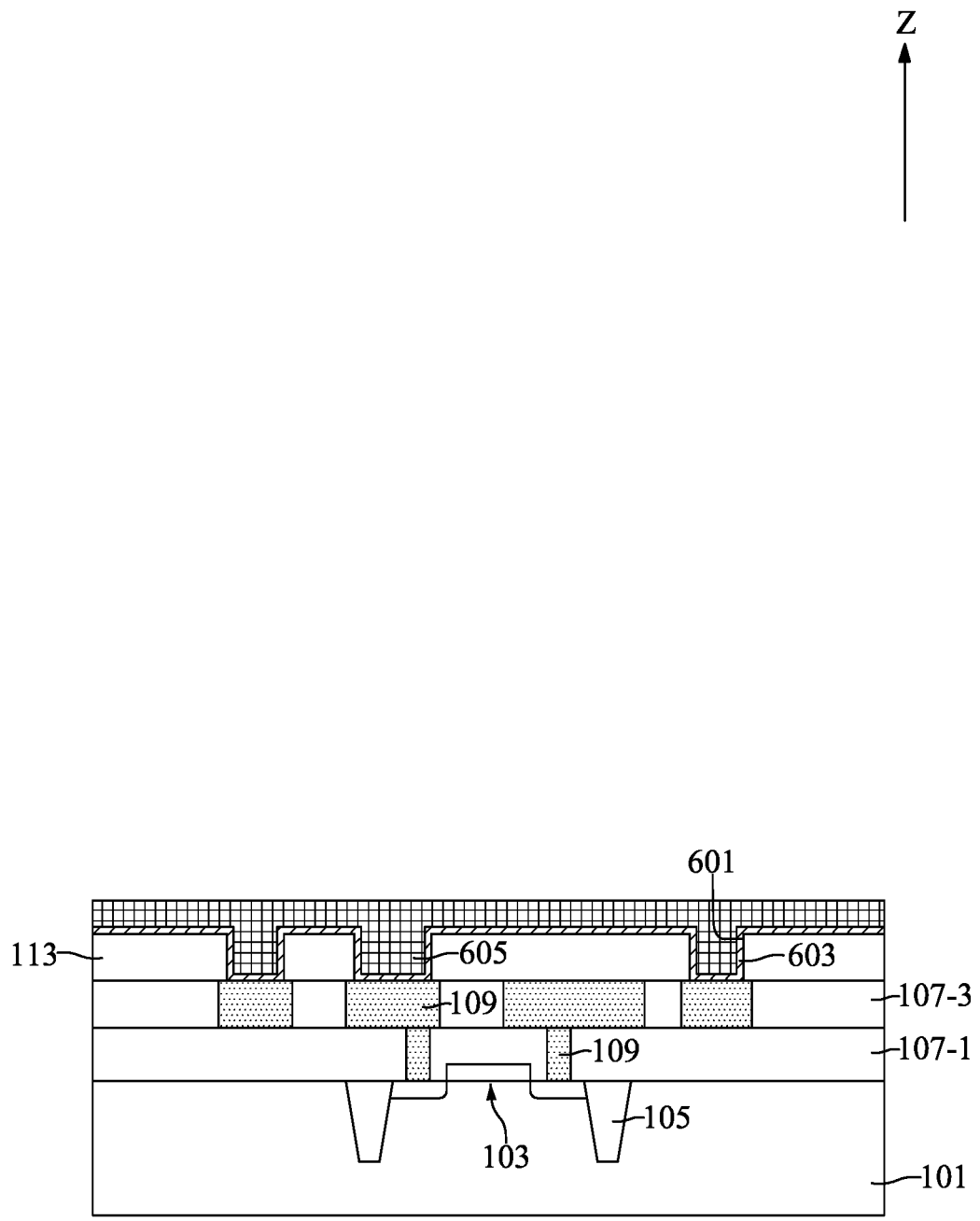

With reference to FIG. 13, a layer of first porous dielectric material 603 may be formed in the plurality of first openings 601 and over the top surface of the first alleviation insulating layer 113. A dielectric constant of the first porous dielectric material 603 may be less than 2.5. With reference to FIG. 14, a layer of first energy-removable material 605 may be formed in the plurality of first openings 601 and over the layer of first porous dielectric material 603. The first energy-removable material 605 may include a material such as a thermally-decomposable material, a photonic-decomposable material, an e-beam decomposable material, or a combination thereof. For example, the first energy-removable material 605 may include a base material and a decomposable porogen material that is sacrificially removed upon exposure to an energy source. The base material may include a methylsilsesquioxane based material, low-dielectric material, or silicon oxide. The decomposable porogen material may include a porogen organic compound that provides porosity to the base material of the energy-removable material.

In some embodiments, the first energy-removable material 605 may include a relatively high concentration of the decomposable porogen material and a relatively low concentration of the base material, but is not limited thereto. For example, the first energy-removable material 605 may include about 75% or greater of the decomposable porogen material, and about 25% or less of the base material. In another example, the first energy-removable material 605 may include about 95% or greater of the decomposable porogen material, and about 5% or less of the base material. In another example, the first energy-removable material 605 may include about 100% of the decomposable porogen material, and no base material is used. In some embodiments, the first energy-removable material 605 may include about 45% or greater of the decomposable porogen material, and about 55% or less of the base material.

Figure 15:
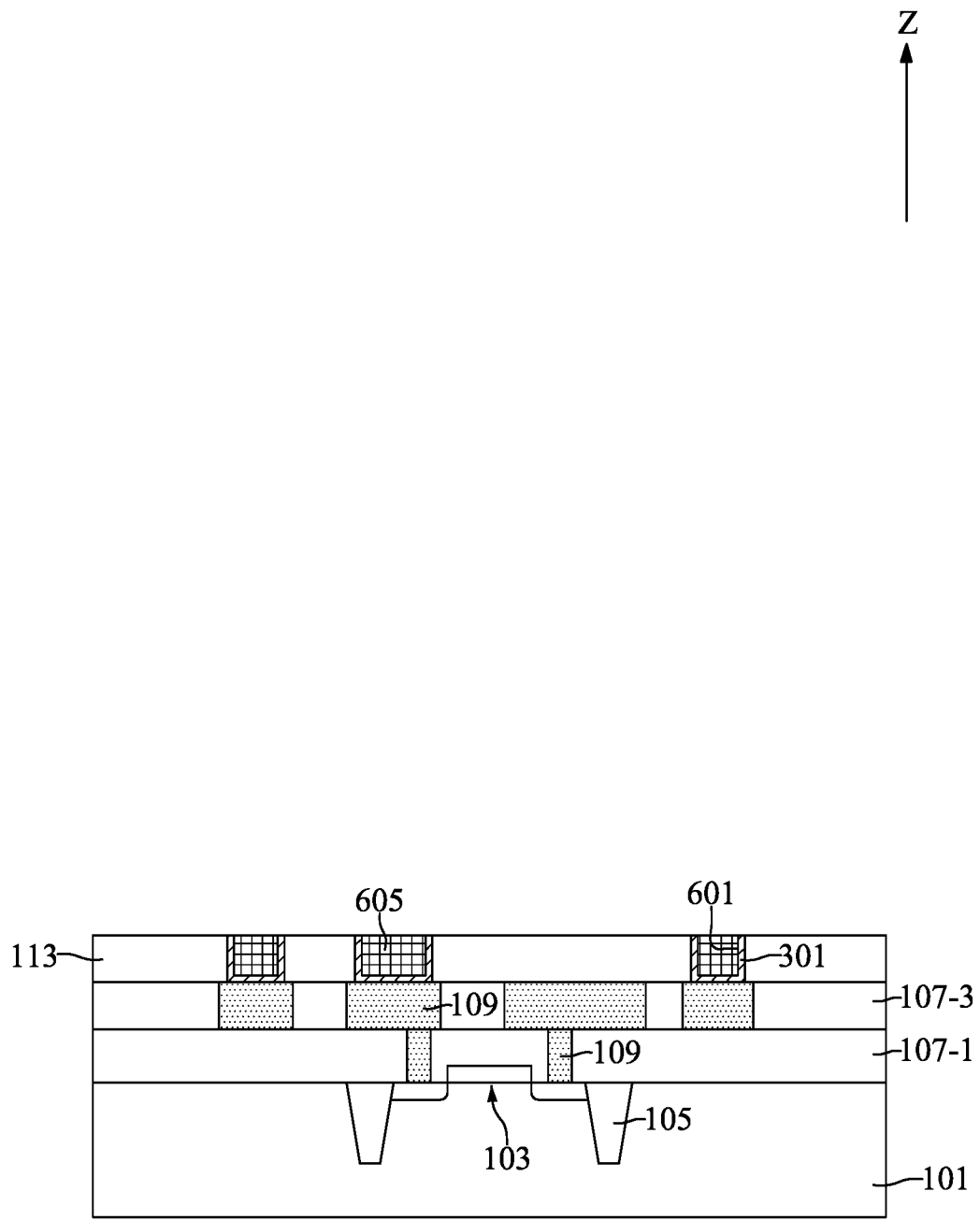

With reference to FIG. 15, a planarization process, such as chemical mechanical polishing, may be performed to remove excess material, provide a substantially flat surface for subsequent processing steps, and conformally turn the layer of first porous dielectric material 603 into the plurality of first porous dielectric layers 301. After the planarization process, the layer of first energy-removable material 605 may be divided into layers of first energy-removable material 605. The top surfaces of the layers of first energy-removable material 605 may be even with the top surface of the first alleviation insulating layer 113.

Figure 16:
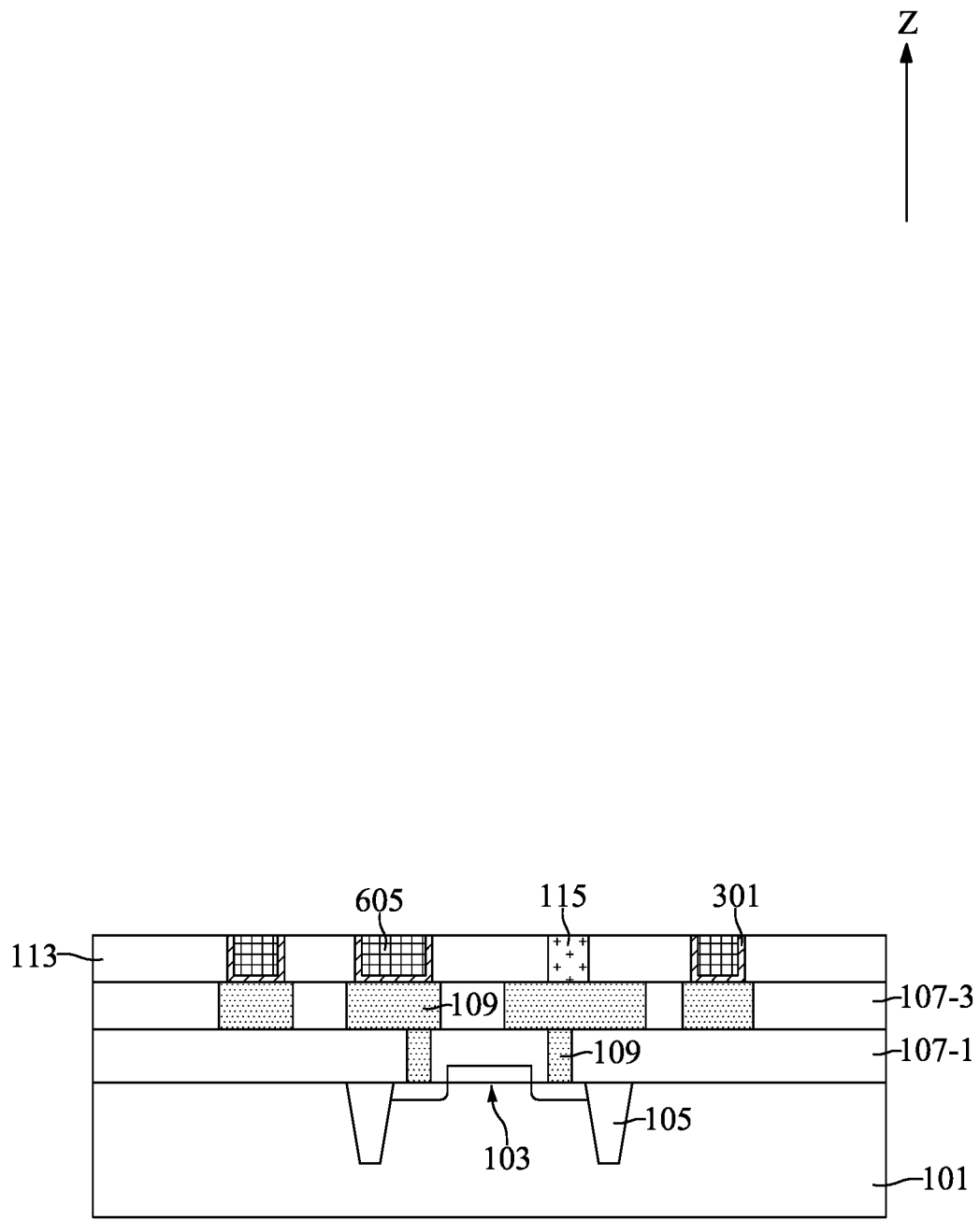
Figure 17:
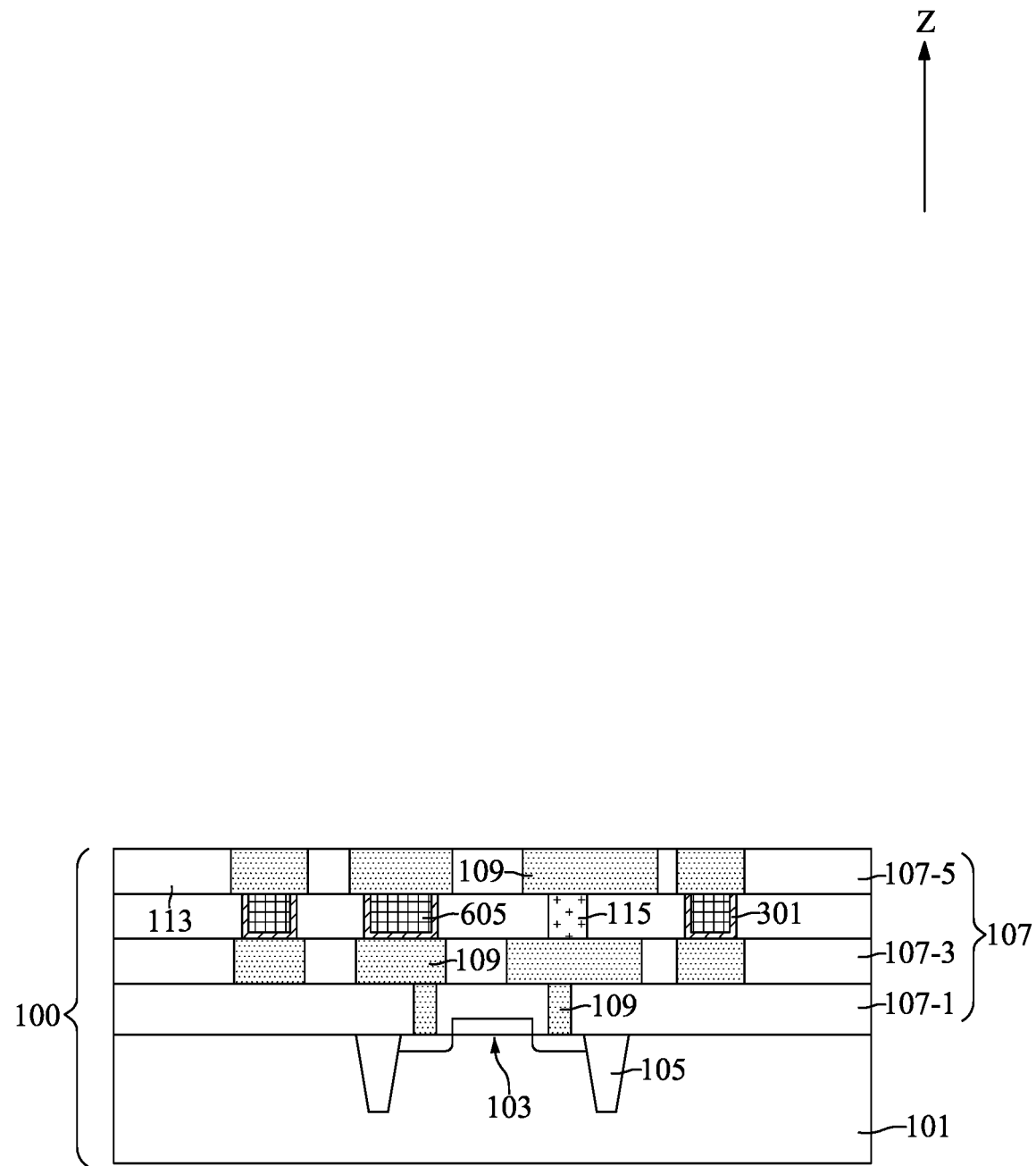

With reference to FIG. 16, a first connecting interlayer 115 may be formed in the first alleviation insulating layer 113 by a damascene process. The first connecting interlayer 115 may be electrically connected to one of the plurality of first conductive features 109 in the first insulating layer 107-3. With reference to FIG. 17, a second insulating layer 107-5 may be formed on the first alleviation insulating layer 113. Some first conductive features 109 may be formed in the second insulating layer 107-5 by another damascene process. One of the plurality of first conductive features 109 in the second insulating layer 107-5 may be electrically connected to the first connecting interlayer 115.

The first inter-dielectric layer 107-1, the first insulating layer 107-3, and the second insulating layer 107-5 together form the first interconnection structure 107. The first substrate 101, the first device element 103, the first isolation layer 105, the first interconnection structure 107, and the plurality of first conductive features 109 together form the first semiconductor structure 100.

With reference to FIG. 11 and FIGS. 18 to 24, at step S13, a first connecting structure 200 may be formed on the first semiconductor structure 100 and a second semiconductor structure 400 may be bonded to the connection structure 200 through a bonding process. The connection structure 200 may include a connection insulating layer 201, a connection layer 203, and a plurality of first porous interlayers 205.

Figure 18:
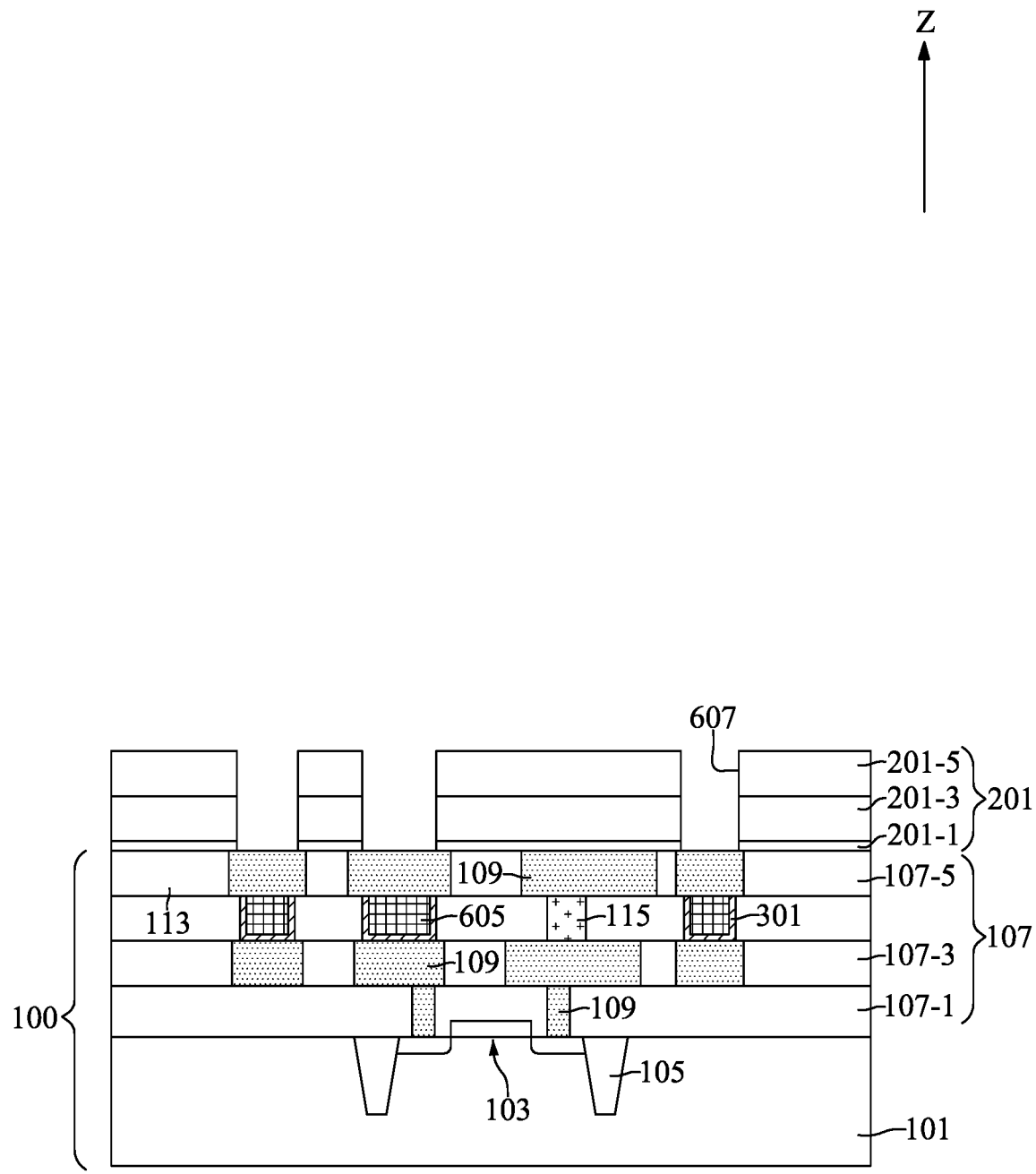

With reference to FIG. 18, a bottom insulating layer 201-1, a middle insulating layer 201-3, and a top insulating layer 201-5 may be sequentially formed on the first semiconductor structure 100 by chemical vapor deposition. A photolithography-etch process may be performed to form a plurality of second openings 607 so as to penetrate the top insulating layer 201-5, the middle insulating layer 201-3, and the bottom insulating layer 201-1. Portions of the top surfaces of some of the plurality of first conductive features 109 in the second insulating layer 107-5 may be exposed through the plurality of second openings 607. The bottom insulating layer 201-1, the middle insulating layer 201-3, and the top insulating layer 201-5 together form a connection insulating layer 201.

Figure 19:
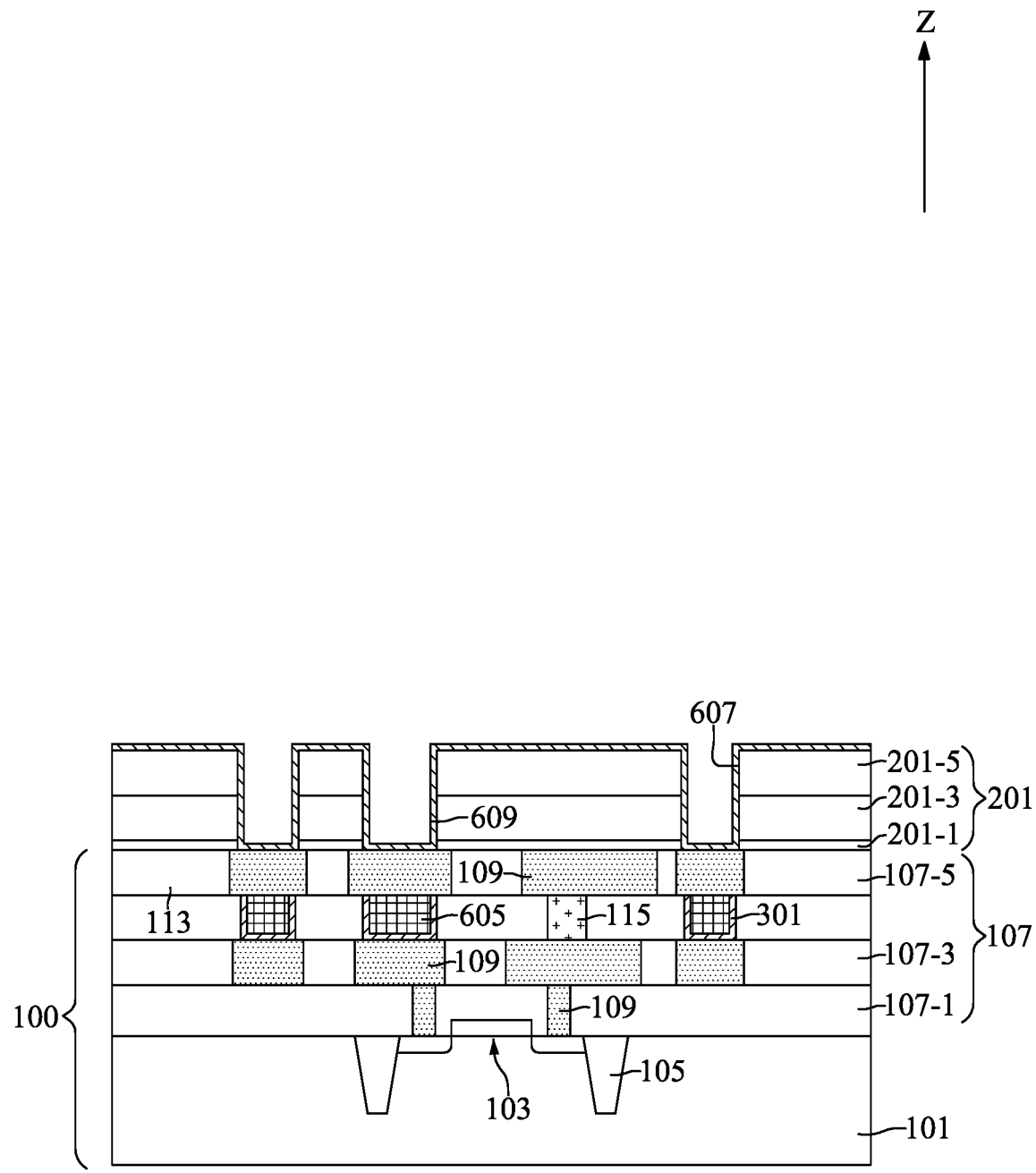
Figure 20:
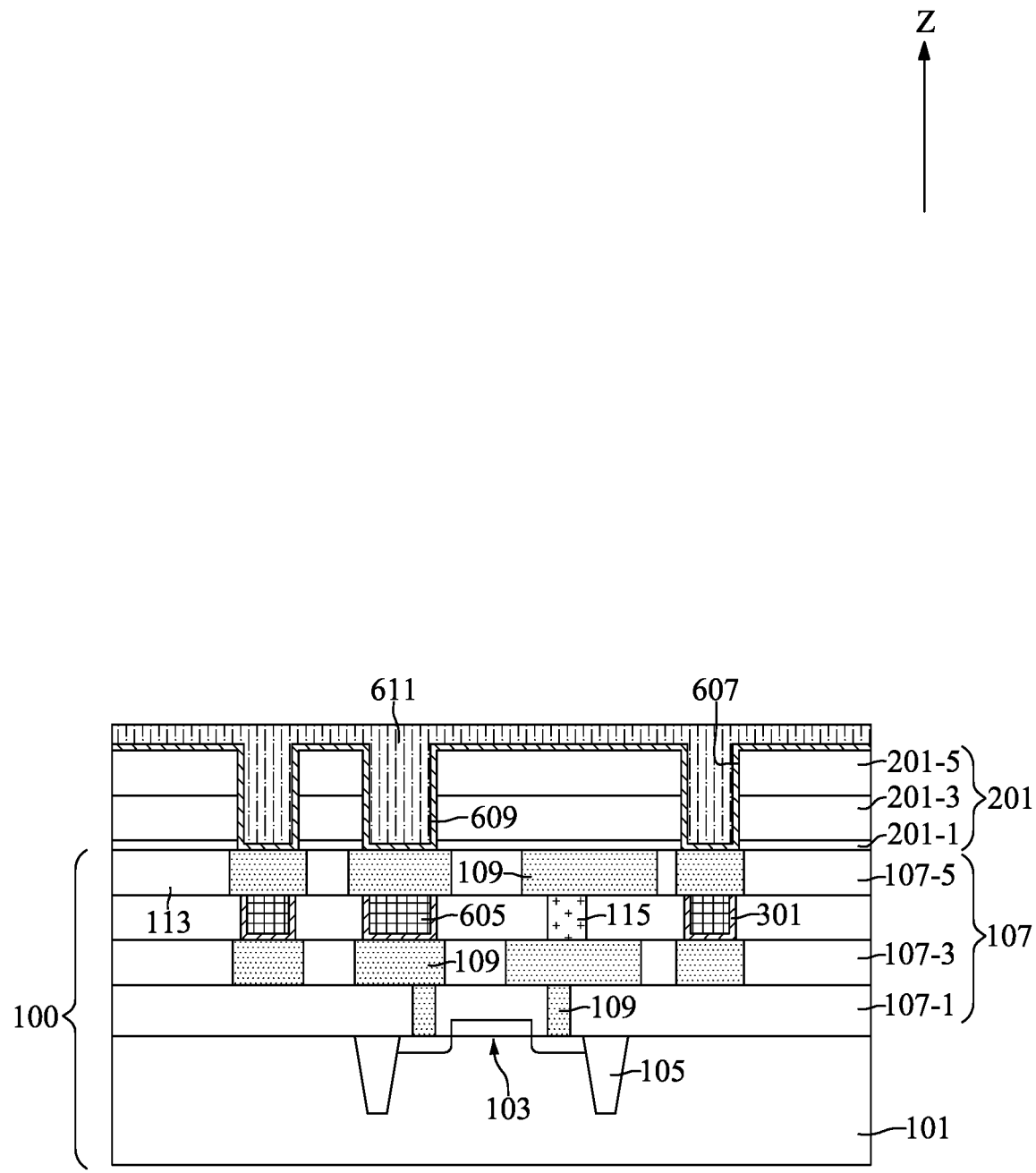

With reference to FIG. 19, a layer of second porous dielectric material 609 may be formed in the plurality of second openings 607 and over the top surface of the top insulating layer 201-5. A dielectric constant of the second porous dielectric material 609 may be less than 2.5. With reference to FIG. 20, a layer of second energy-removable material 611 may be formed in the plurality of second openings 607 and over the layer of second porous dielectric material 609. The second energy-removable material 611 may have a composition similar to that of the first energy-removable material 605.

Figure 21:
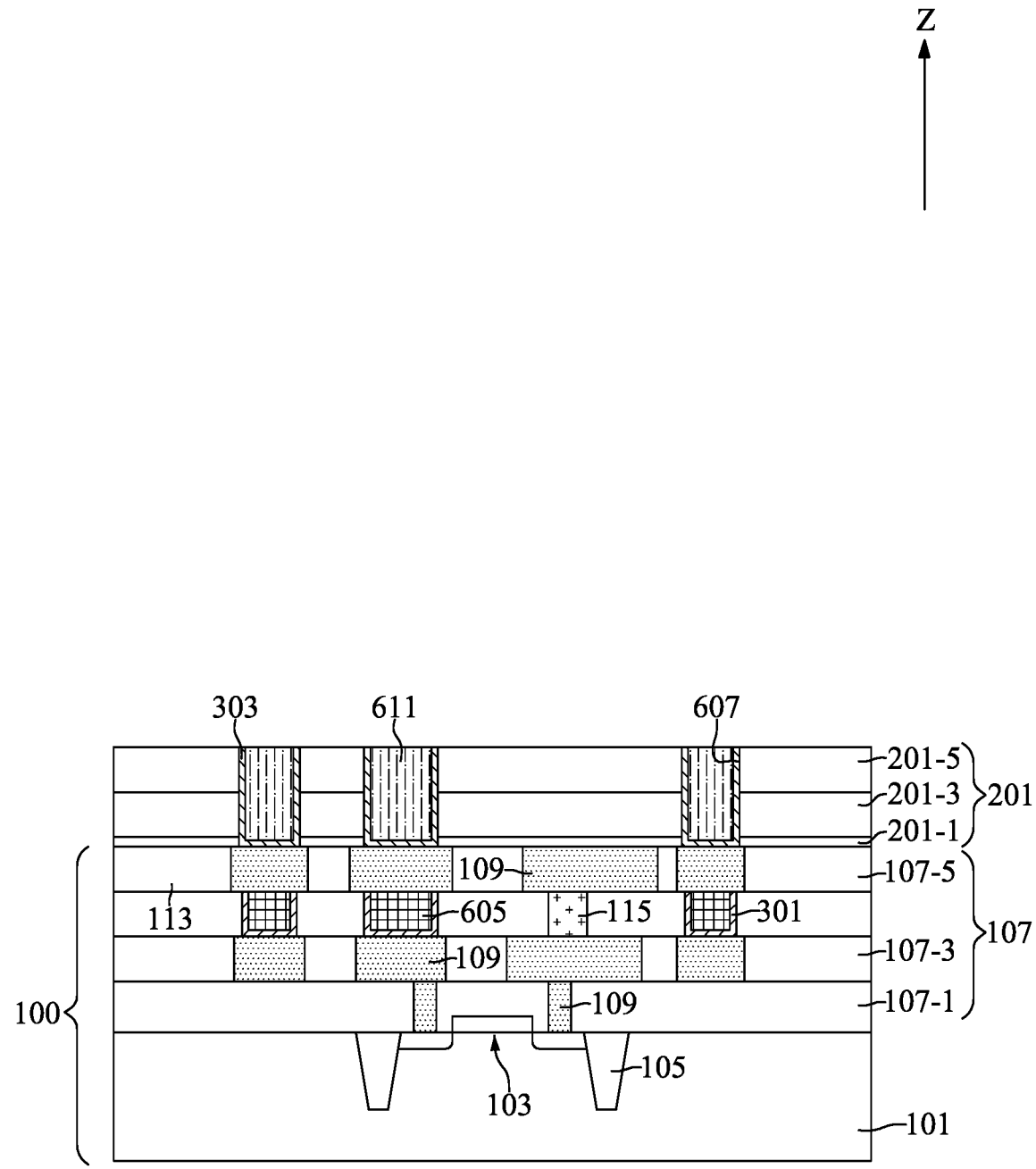

With reference to FIG. 21, a planarization process, such as chemical mechanical polishing, may be performed to remove excess material, provide a substantially flat surface for subsequent processing steps, and conformally turn the layer of second porous dielectric material 609 into the plurality of second porous dielectric layers 303. After the planarization process, the layer of second energy-removable material 611 may be divided into layers of second energy-removable material 611. The top surfaces of the layers of second energy-removable material 611 may be even with the top surface of the top insulating layer 201-5.

Figure 22:
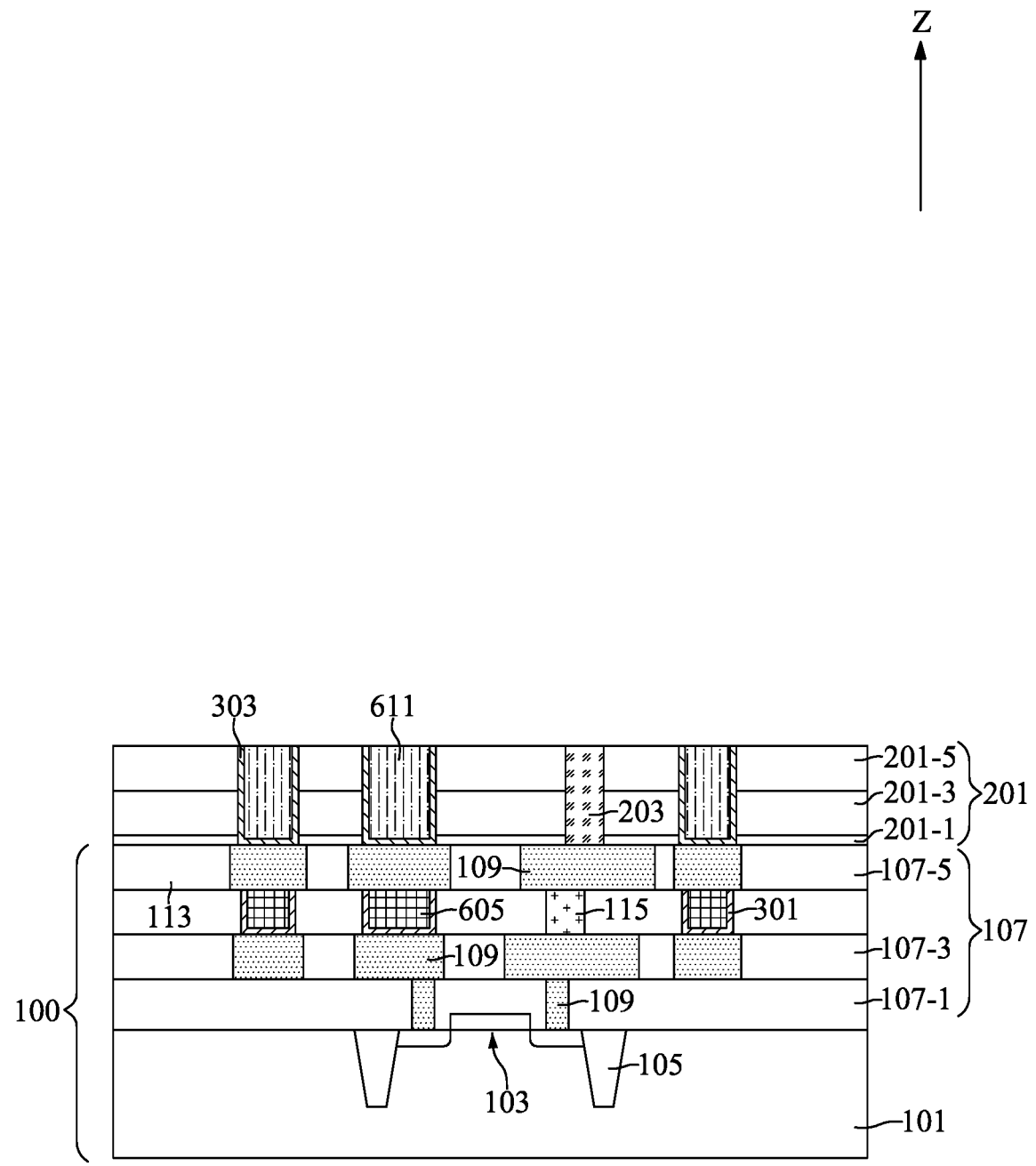

With reference to FIG. 22, a connection layer 203 may be formed so as to penetrate the connection insulating layer 201 by a damascene process. The connection layer 203 may be electrically connected to one of the plurality of first conductive features 109 in the second insulating layer 107-5.

Figure 23:
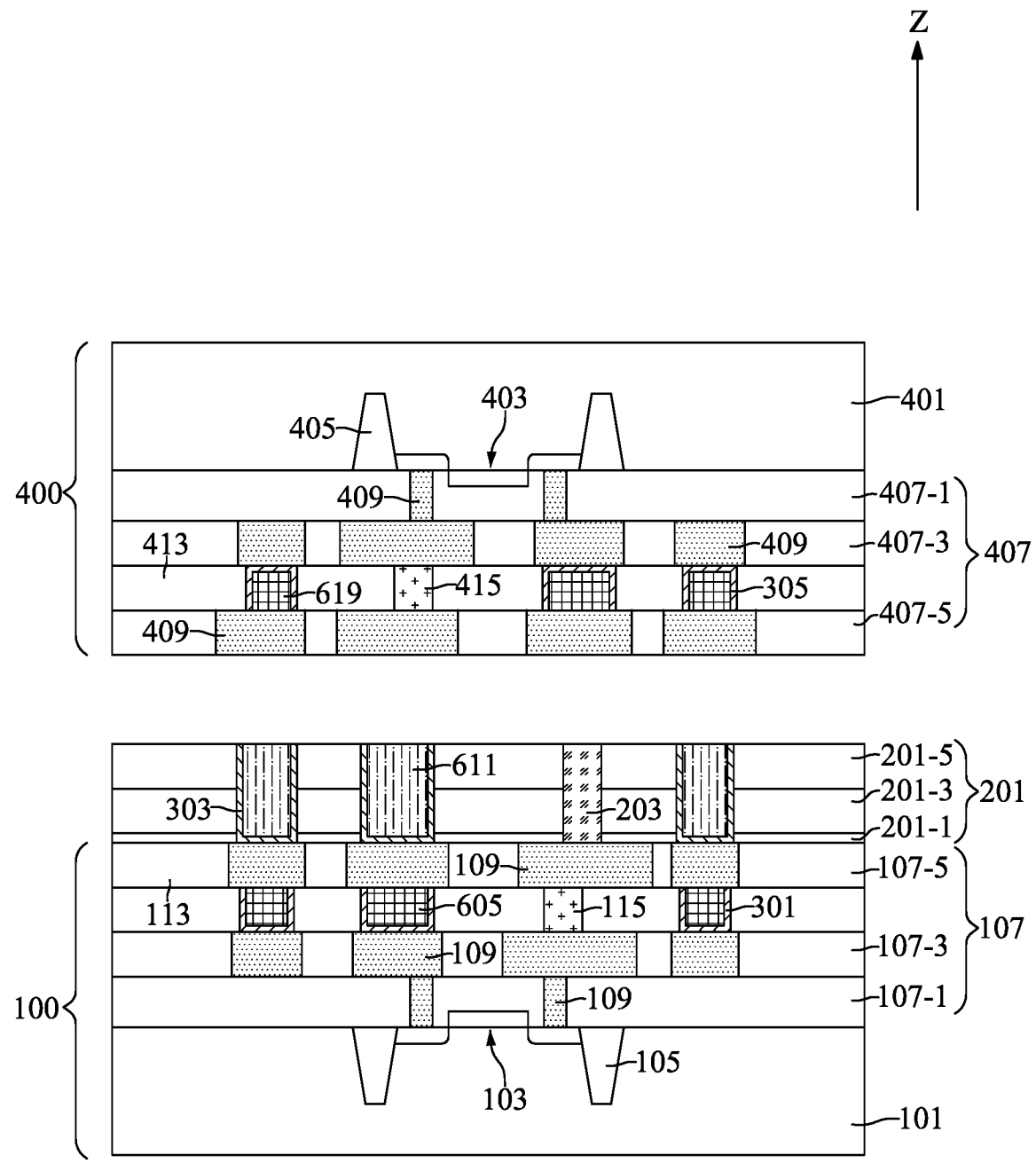

With reference to FIG. 23, the second semiconductor structure 400 may be provided. The second semiconductor structure 400 may be formed by a procedure similar to that used to form the first semiconductor structure 100, and the second semiconductor structure may have a structure similar to that of the first semiconductor structure 100. The second semiconductor structure 400 may be disposed in an upside-down manner. A second alleviation insulating layer 413, a second connecting interlayer 415, layers of fourth energy-removable material 619, and a plurality of third porous dielectric layers 305 may be formed in procedures similar to those used to form the first alleviation insulating layer 113, the first connecting interlayer 115, the layers of first energy-removable material 605, and the plurality of first porous dielectric layers 301, respectively.

Figure 24:
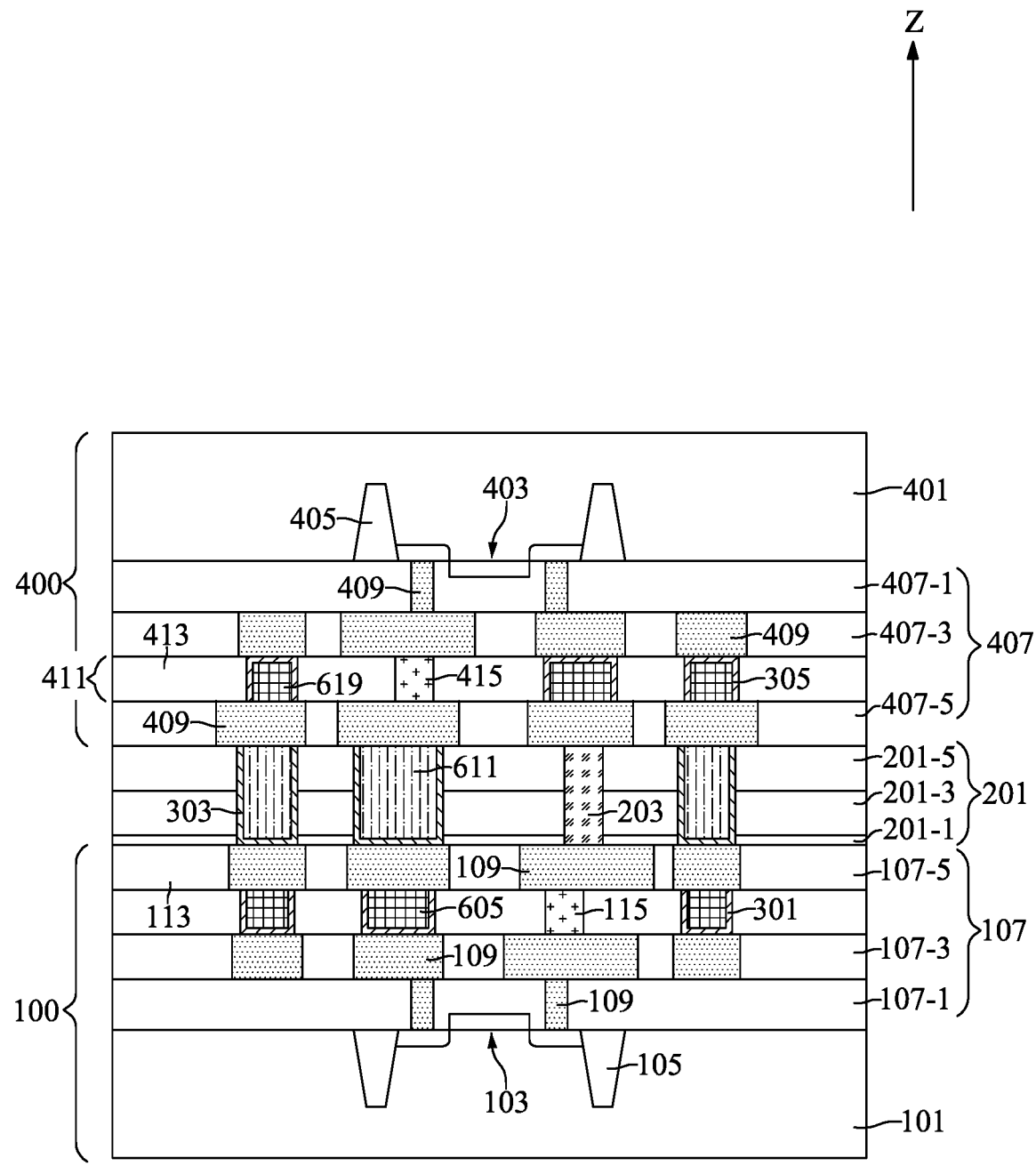

With reference to FIG. 24, the upside-down second semiconductor structure 400 may be disposed on the top surface of the top insulating layer 201-5. The bonding process may include a thermal treatment performed to achieve a hybrid bonding between elements of the second semiconductor structure 400 and the connection structure 200. The hybrid bonding may include an oxide-to-oxide bonding and a metal-to-metal bonding. The oxide-to-oxide bonding may originate from the bonding between the top insulating layer 201-5 and the fourth insulating layer 407-5. The metal-to-metal bonding may originate from the bonding between the connection layer 203 and a corresponding one of the plurality of second conductive features 409 in the fourth insulating layer 407-5. A temperature of the bonding process may be between about 300° C. and about 450° C. In some embodiments, a thinning process may be performed on the second substrate 401 using an etching process, a chemical polishing process, or a grinding process to reduce a thickness of the second substrate 401.

Figure 25:
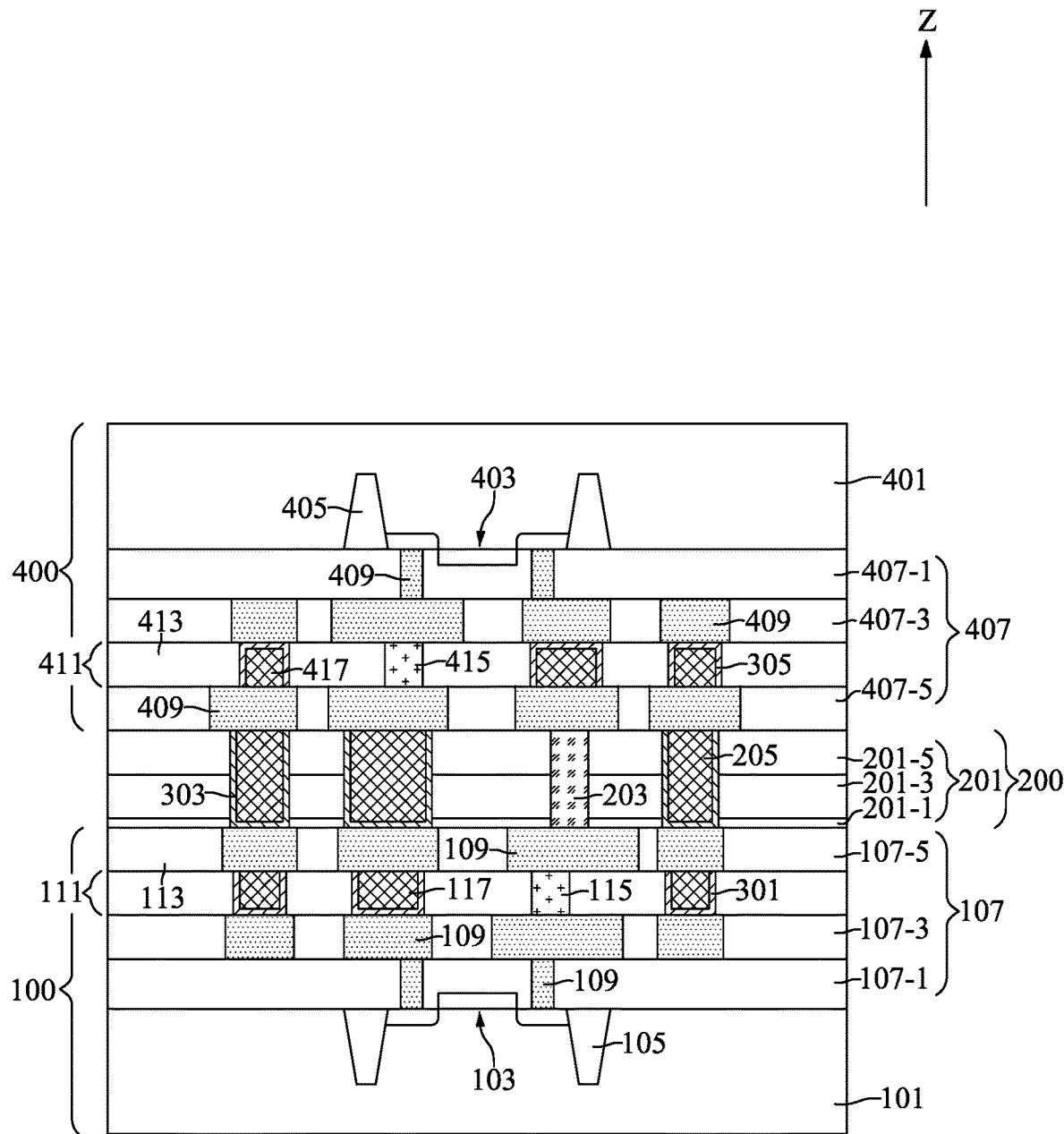

With reference to FIGS. 11 and 25, at step S15, an energy treatment may be performed to turn the layer of second energy-removable material 611 into a plurality of first porous interlayers 205. Concurrently, the energy treatment may also turn the layers of first energy-removable material 605 into a plurality of first alleviation layers 117 and turn the layers of fourth energy-removable material 619 into a plurality of second alleviation layers 417. The energy treatment process may be performed on the intermediate semiconductor device in FIG. 24 by applying the energy source thereto.

The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the second energy-removable material 611, the first energy-removable material 605, and the fourth energy-removable material 619 to generate empty spaces (pores), with the base material remaining in place. In some embodiments, the energy treatment process may be performed before the bonding process. In some embodiments, the energy treatment process may be performed concurrently with the bonding process by providing a temperature between about 800° C. and about 900° C. for the bonding process. As a result, the complexity of fabrication of the semiconductor device 10A may be reduced and a fabrication cost of the semiconductor device 10A may be also reduced.

The first alleviation insulating layer 113, the first connecting interlayer 115, and the plurality of first alleviation layers 117 together form a first alleviation structure 111. The second alleviation insulating layer 413, the second connecting interlayer 415, and the plurality of second alleviation layers 417 together form a second alleviation structure 411.

Figure 26:
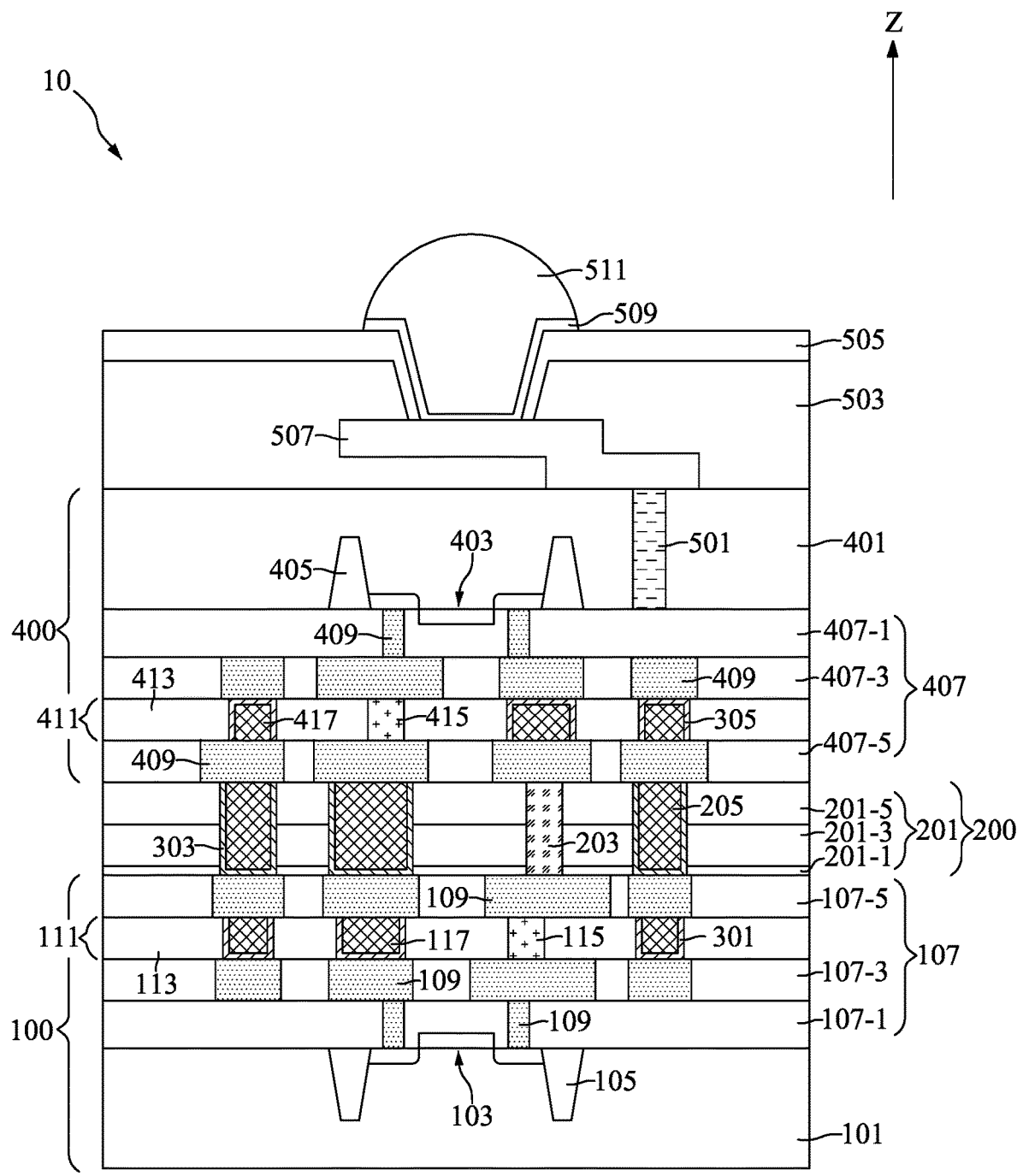

With reference to FIGS. 11 and 26, at step S17, a through substrate via 501 may be formed in the second substrate 401, and a bottom passivation layer 503, a top passivation layer 505, a redistribution layer 507, an under bump metallization layer 509, and a conductive bump 511 may be formed on the second substrate 401. A photolithography process may be performed to define a position of the through substrate via 501. After the photolithography process, an etch process, such as an anisotropic dry etch process, may be performed to form an opening in the second substrate 401. A conductive material such as copper, aluminum, or titanium may be deposited into the opening by a deposition process. After the deposition process, a planarization process, such as chemical mechanical polishing, may be performed to remove excess material, provide a substantially flat surface for subsequent processing steps, and conformally form the through substrate via 501.

With reference to FIG. 26, the bottom passivation layer 503 and the top passivation layer 505 may be sequentially formed on the through substrate via 501. The redistribution layer 507 may be formed in the bottom passivation layer 503 and on the through substrate via 501. A portion of the bottom passivation layer 503 and a portion of the top passivation layer 505 may be recessed to form an opening to expose a portion of a top surface of the redistribution layer 507. The under bump metallization layer 509 and the conductive bump 511 may be sequentially formed in the opening.

FIGS. 27 to 30 illustrate, in schematic cross-sectional view diagrams, a flow for fabricating a semiconductor device 10D in accordance with another embodiment of the present disclosure.

Figure 27:
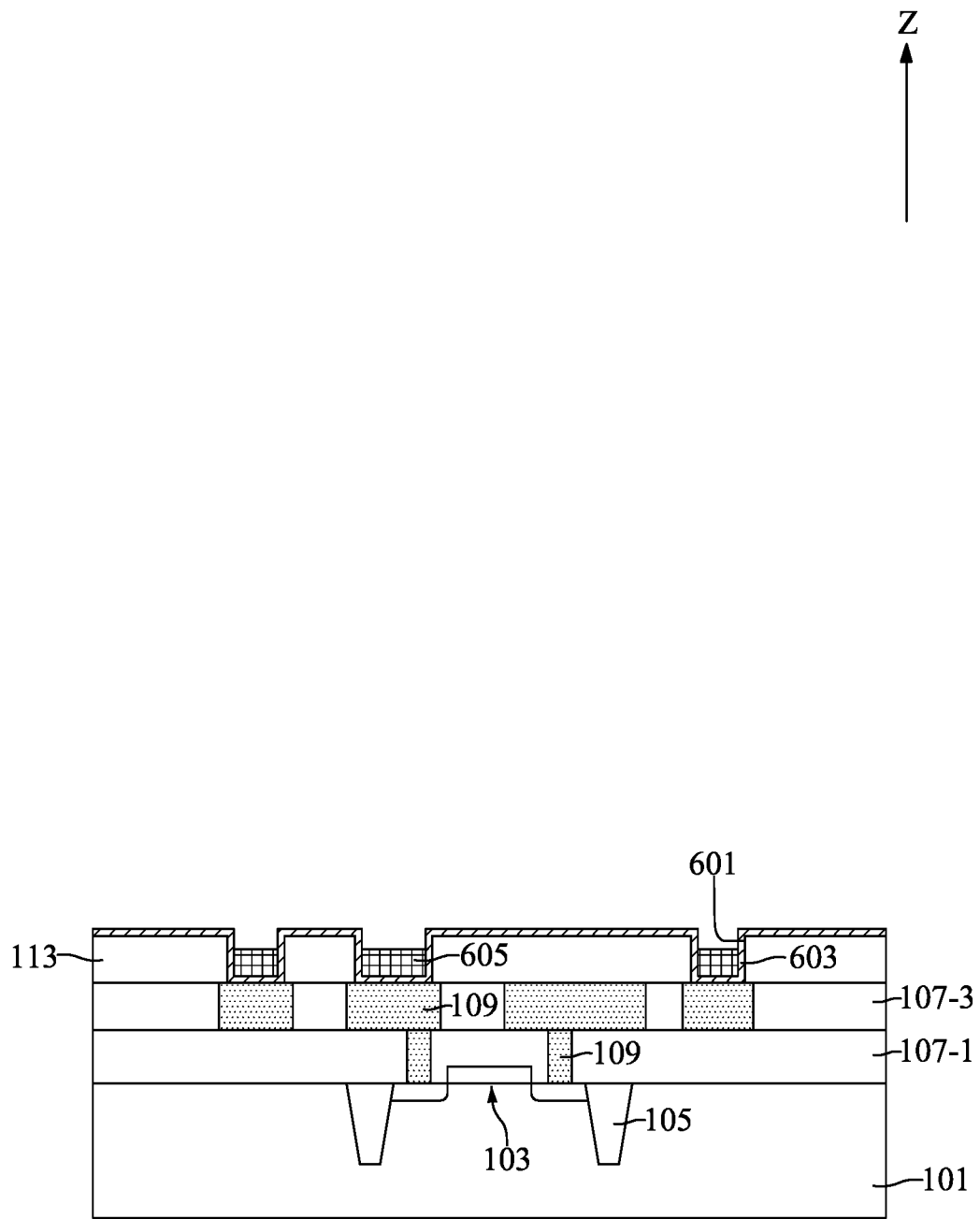
FIGS. 27 to 30 illustrate, in schematic cross-sectional view diagrams, a flow for fabricating a semiconductor device in accordance with one embodiment of the present disclosure.

With reference to FIG. 27, an intermediate semiconductor device may be fabricated by a procedure similar to that illustrated in FIGS. 12 to 14. Subsequently, an etch back process may be performed to remove portions of the layer of first energy-removable material 605 until a top surface of the layer of first energy-removable material 605 is lower than the top surface of the first alleviation insulating layer 113.

Figure 28:
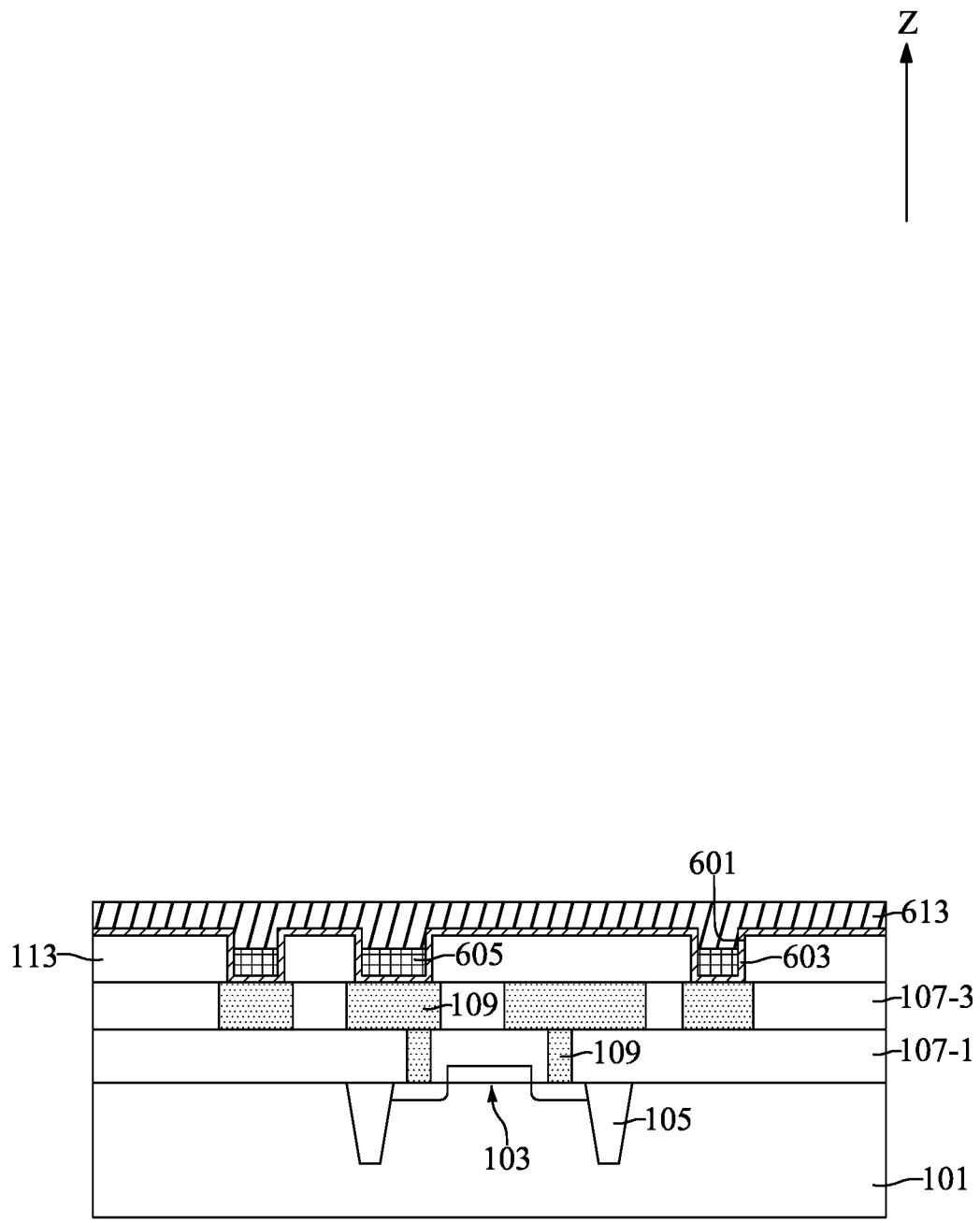
Figure 29:
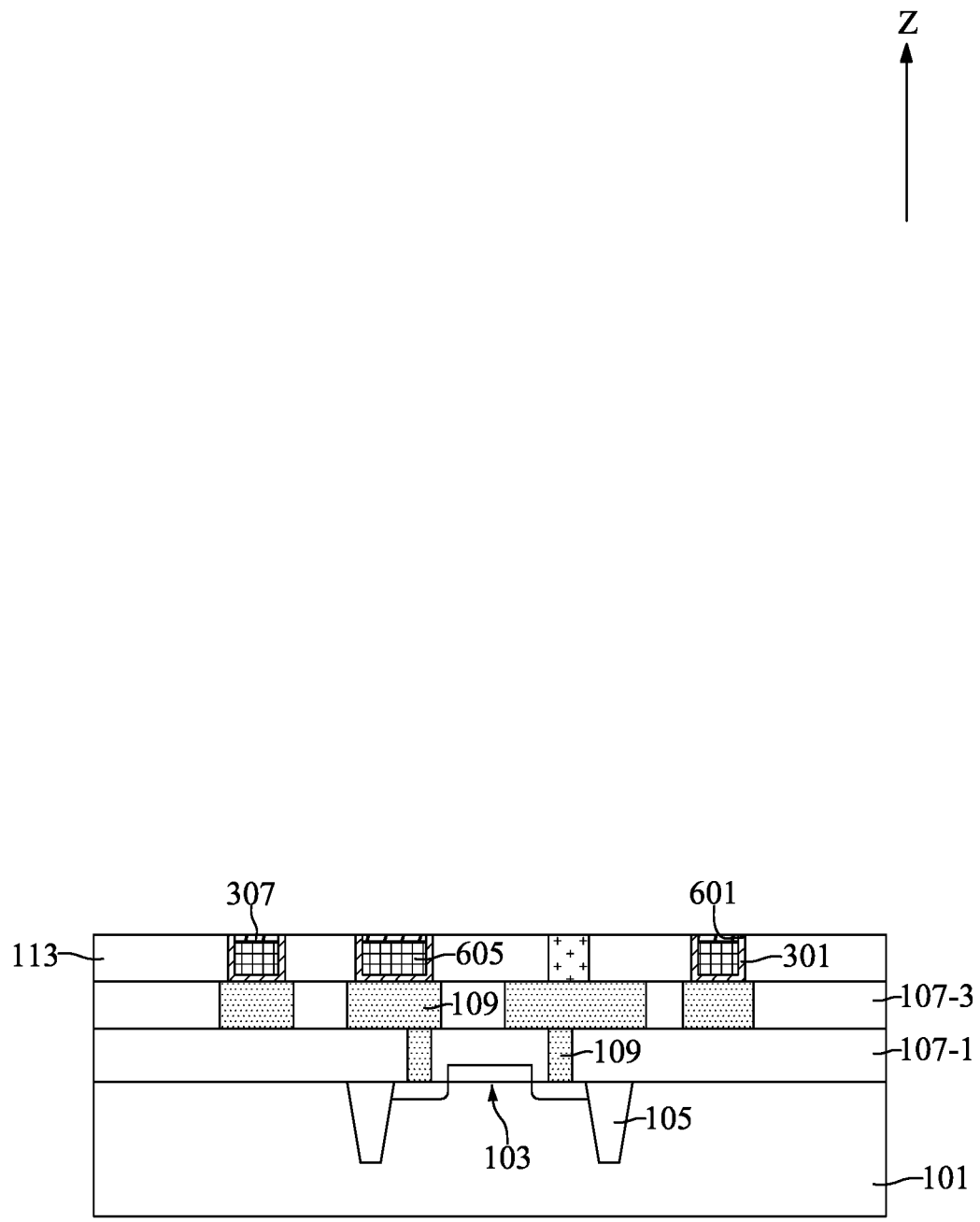
Figure 30:
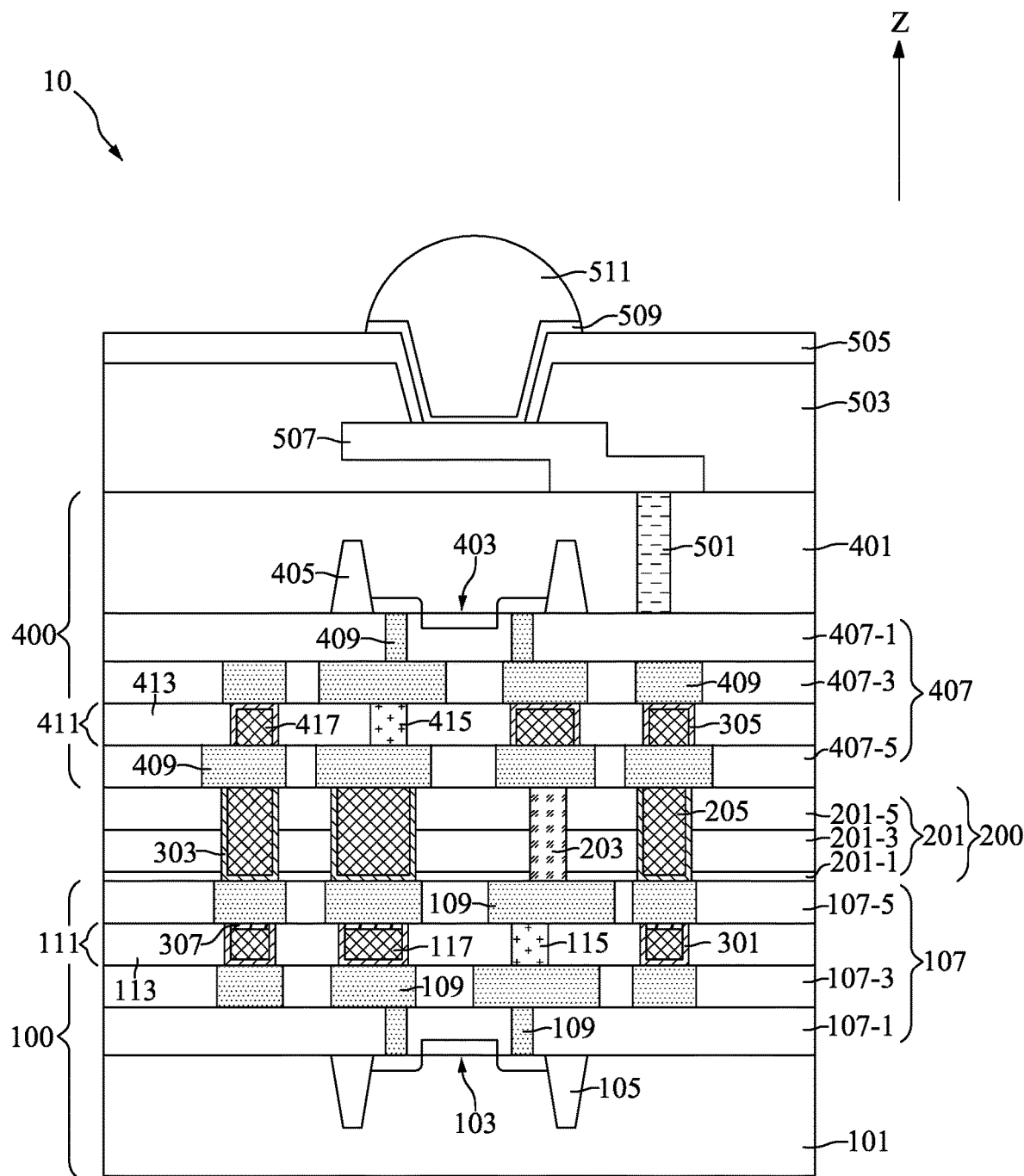

With reference to FIG. 28, a layer of third porous dielectric material 613 may be formed to cover the layer of first porous dielectric material 603 and the layer of first energy-removable material 605. Bottom surfaces of the layer of third porous dielectric material 613 may be lower than the top surface of the first alleviation insulating layer 113. A dielectric constant of the third porous dielectric material 613 may be less than 2.5. With reference to FIG. 29, a planarization process, such as chemical mechanical polishing, may be performed until the top surface of the first alleviation insulating layer 113 is exposed to turn the layer of first porous dielectric material 603 into a plurality of first porous dielectric layers 301 and turn the layer of third porous dielectric material 613 into a plurality of first top porous dielectric layers 307. With reference to FIG. 30, the second insulating layer 107-5, the connection structure 200, the second semiconductor structure 400, and other elements may be formed by a procedure similar to that illustrated in FIGS. 16 to 26.

FIGS. 31 to 34 illustrate, in schematic cross-sectional view diagrams, a flow for fabricating a semiconductor device 10F in accordance with another embodiment of the present disclosure.

Figure 31:
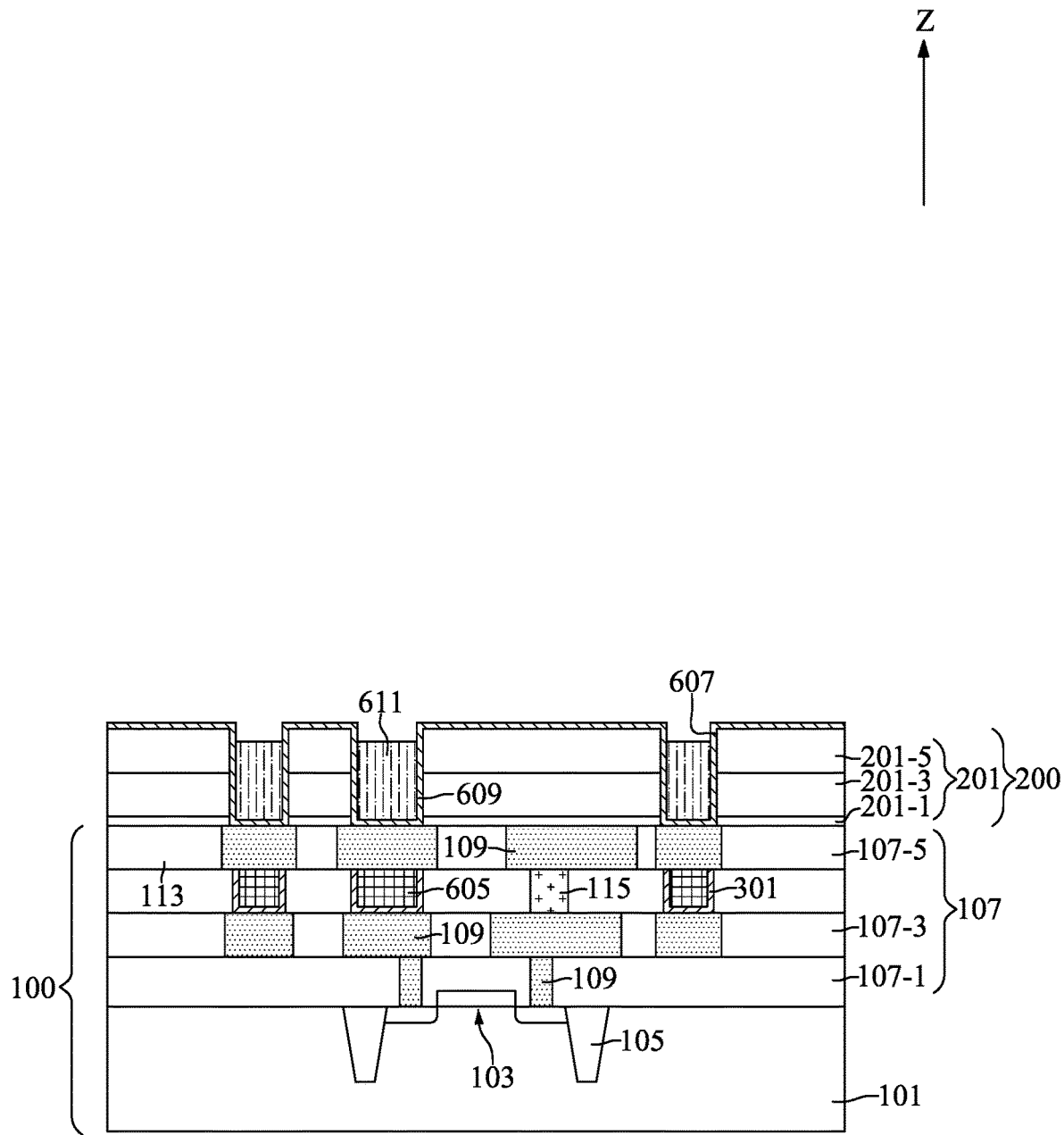
FIGS. 31 to 34 illustrate, in schematic cross-sectional view diagrams, a flow for fabricating a semiconductor device in accordance with one embodiment of the present disclosure.

With reference to FIG. 31, an intermediate semiconductor device may be fabricated by a procedure similar to that illustrated in FIGS. 12 to 20. Subsequently, an etch back process may be performed to remove portions of the layer of second energy-removable material 611 until a top surface of the layer of second energy-removable material 611 is lower than the top surface of the top insulating layer 201-5.

Figure 32:
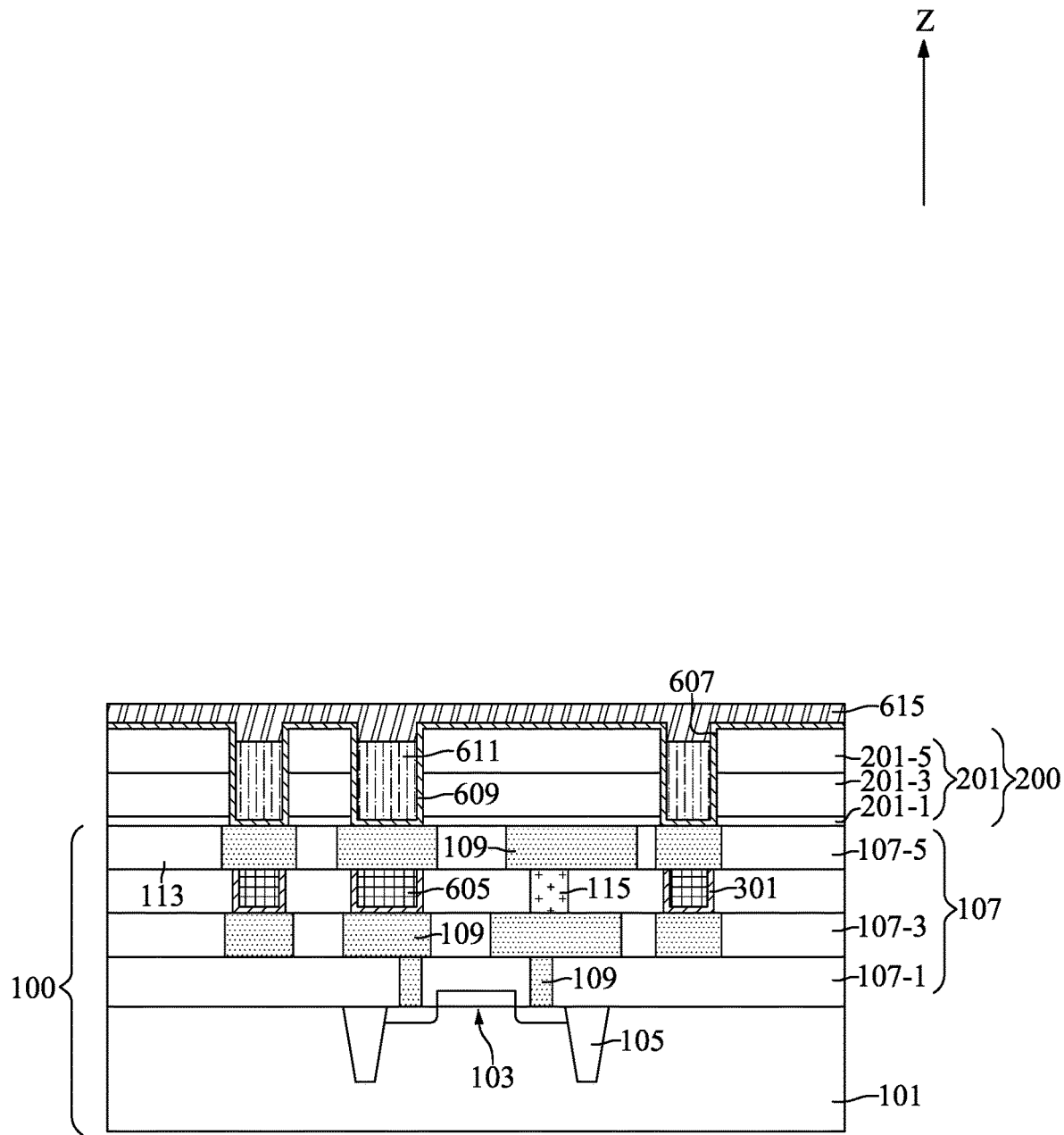
Figure 33:
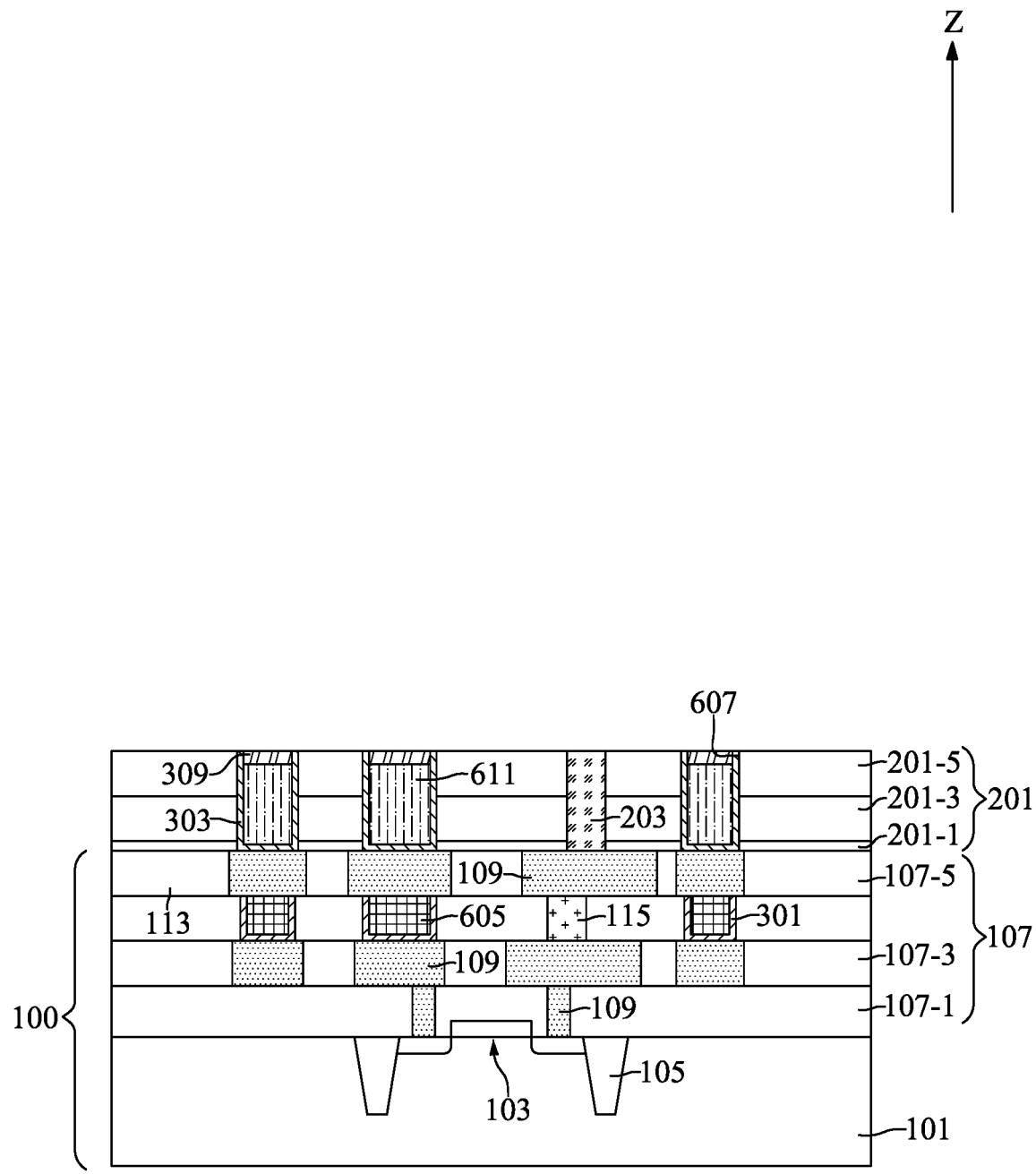
Figure 34:
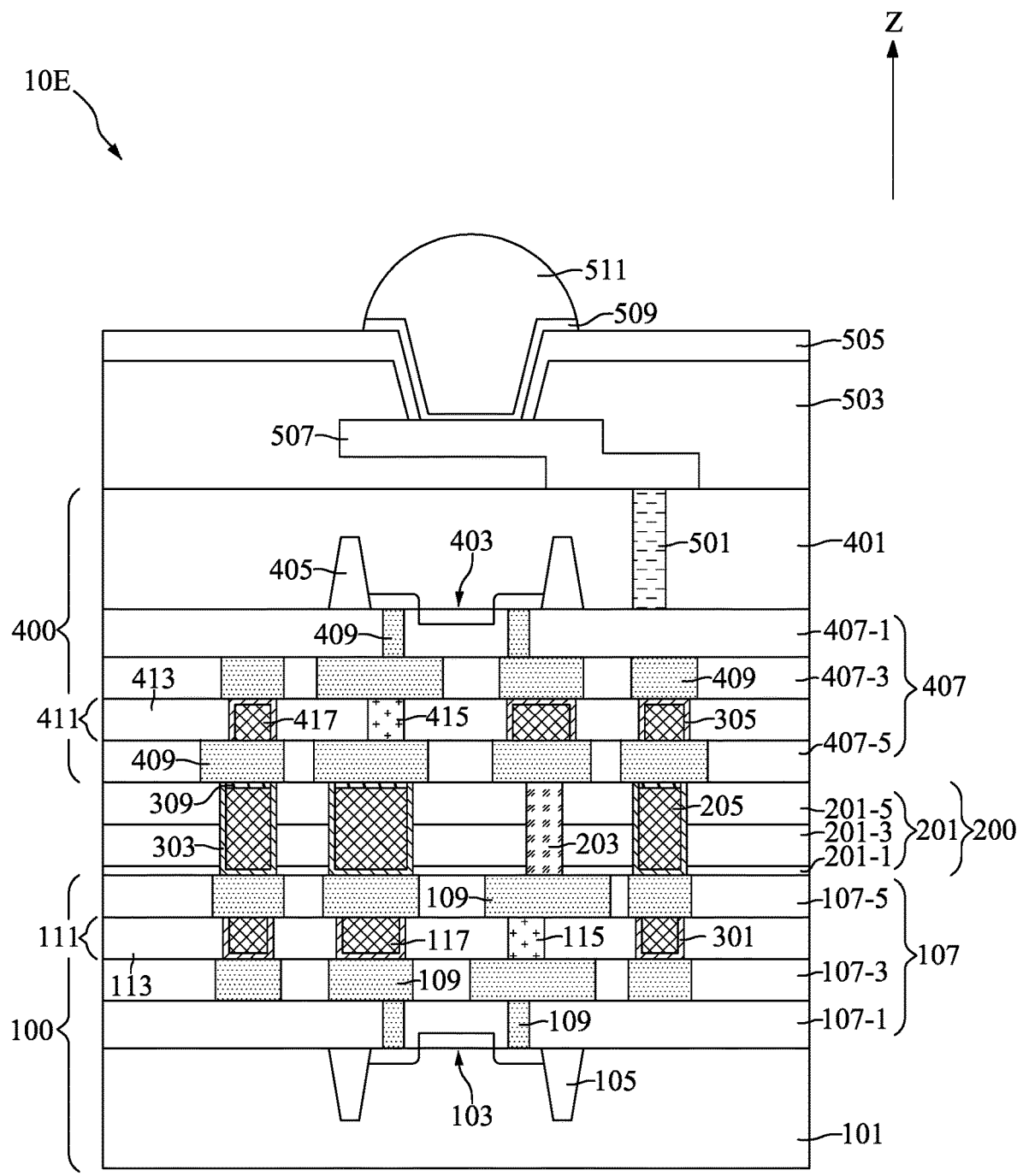

With reference to FIG. 32, a layer of fourth porous dielectric material 615 may be formed to cover the layer of second energy-removable material 611 and the layer of second porous dielectric material 609. Bottom surfaces of the layer of fourth porous dielectric material 615 may be lower than the top surface of the top insulating layer 201-5. A dielectric constant of the fourth porous dielectric material 615 may be less than 2.5. With reference to FIG. 33, a planarization process, such as chemical mechanical polishing, may be performed until the top surface of the top insulating layer 201-5 is exposed to turn the layer of second porous dielectric material 609 into a plurality of second porous dielectric layers 303 and turn the layer of fourth porous dielectric material 615 into a plurality of second top porous dielectric layers 309. With reference to FIG. 34, the connection layer 203, the second semiconductor structure 400, and other elements may be formed by a procedure similar to that illustrated in FIGS. 23 to 26.

FIGS. 35 to 39 illustrate, in schematic cross-sectional view diagrams, a flow for fabricating a semiconductor device 10G in accordance with another embodiment of the present disclosure.

Figure 35:
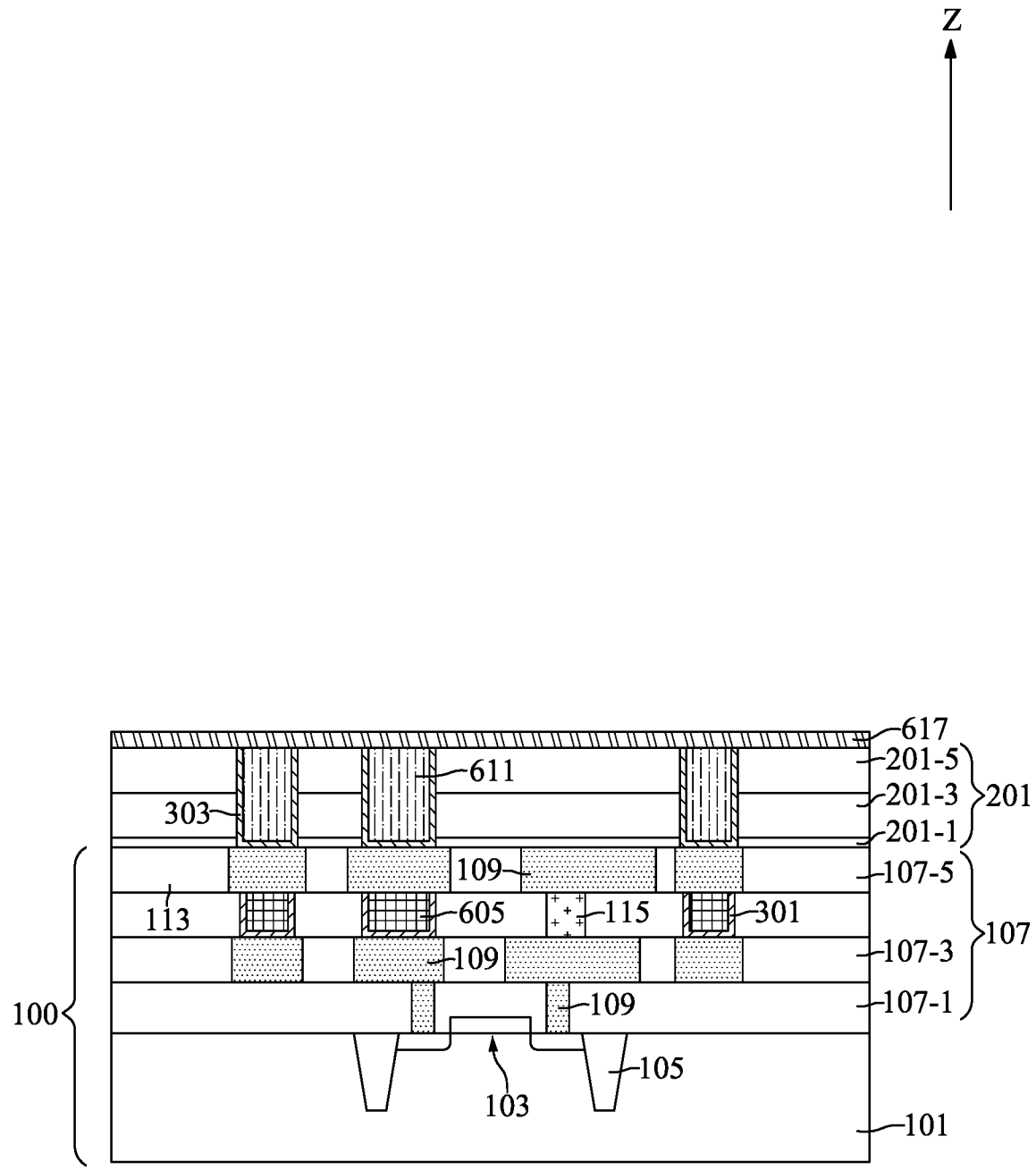
FIGS. 35 to 39 illustrate, in schematic cross-sectional view diagrams, a flow for fabricating a semiconductor device in accordance with one embodiment of the present disclosure.
Figure 36:
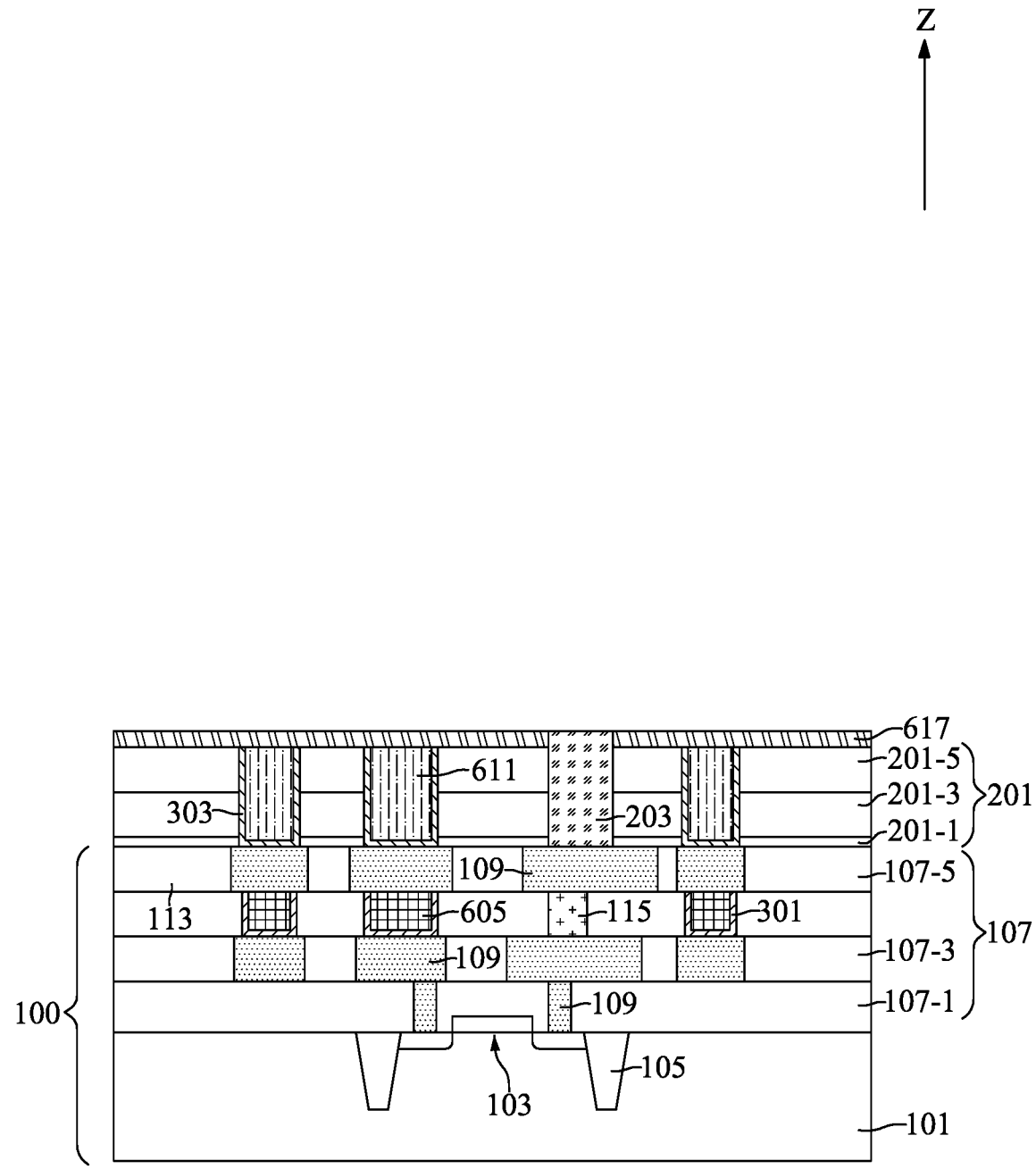

With reference to FIG. 35, an intermediate semiconductor device may be fabricated by a procedure similar to that illustrated in FIGS. 12 to 21. A layer of third energy-removable material 617 may be formed on the top insulating layer 201-5. The third energy-removable material 617 may include about 25% to about 50% of the decomposable porogen material, and about 50% to about 75% of the base material. With reference to FIG. 36, a connection layer 203 may be formed so as to penetrate the layer of third energy-removable material 617 and the connection insulating layer 201.

Figure 37:
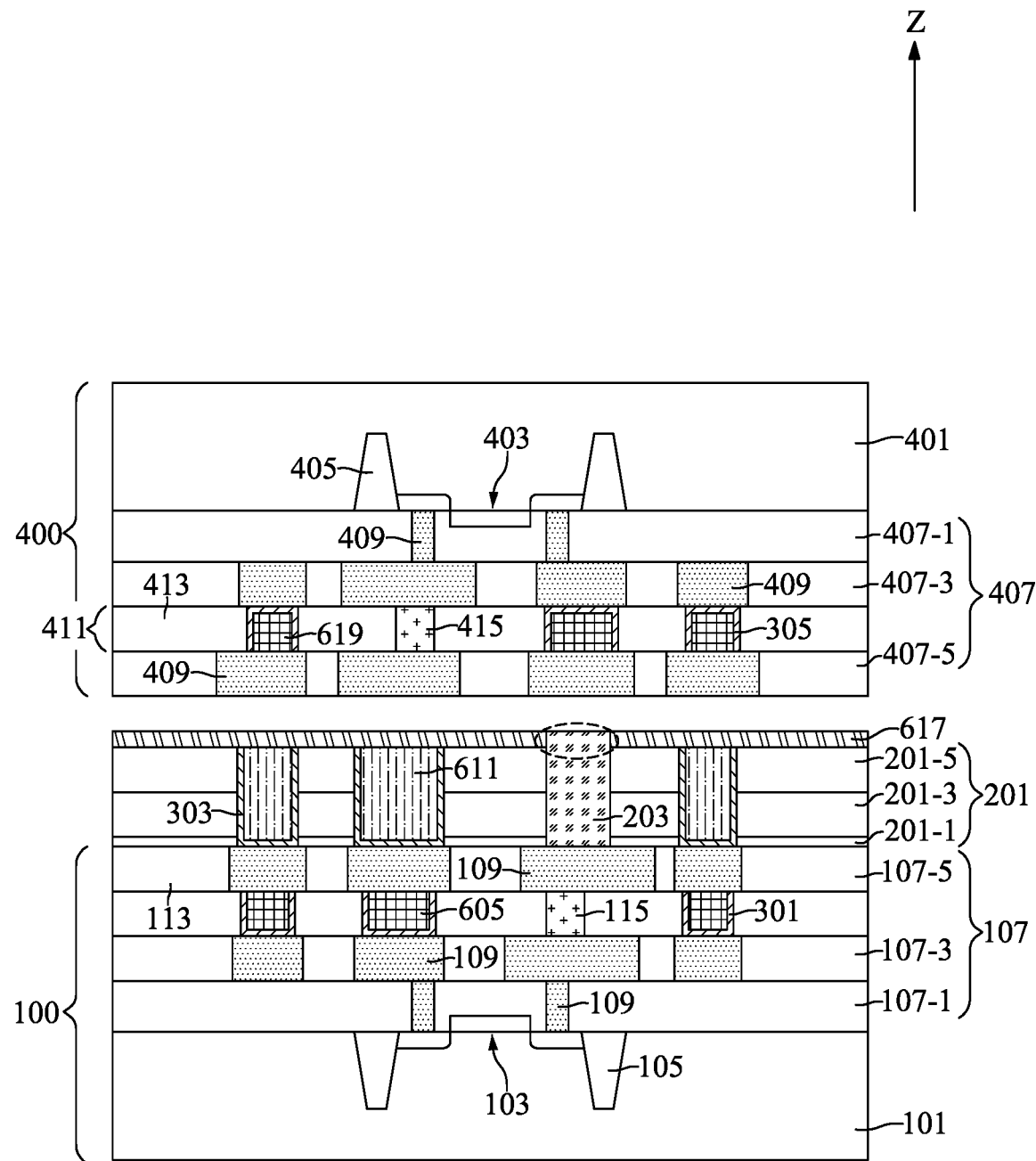
Figure 38:
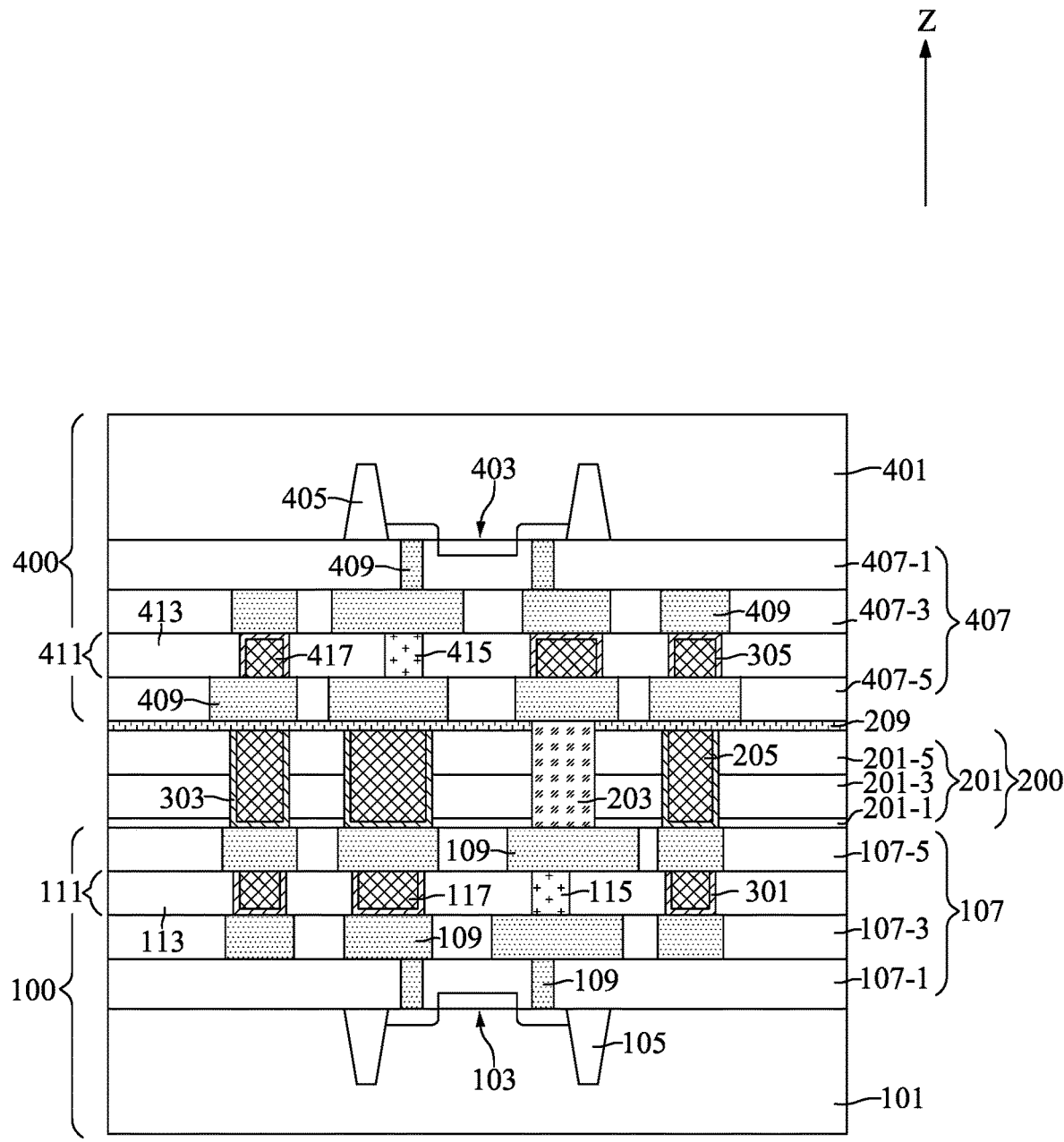
Figure 39:
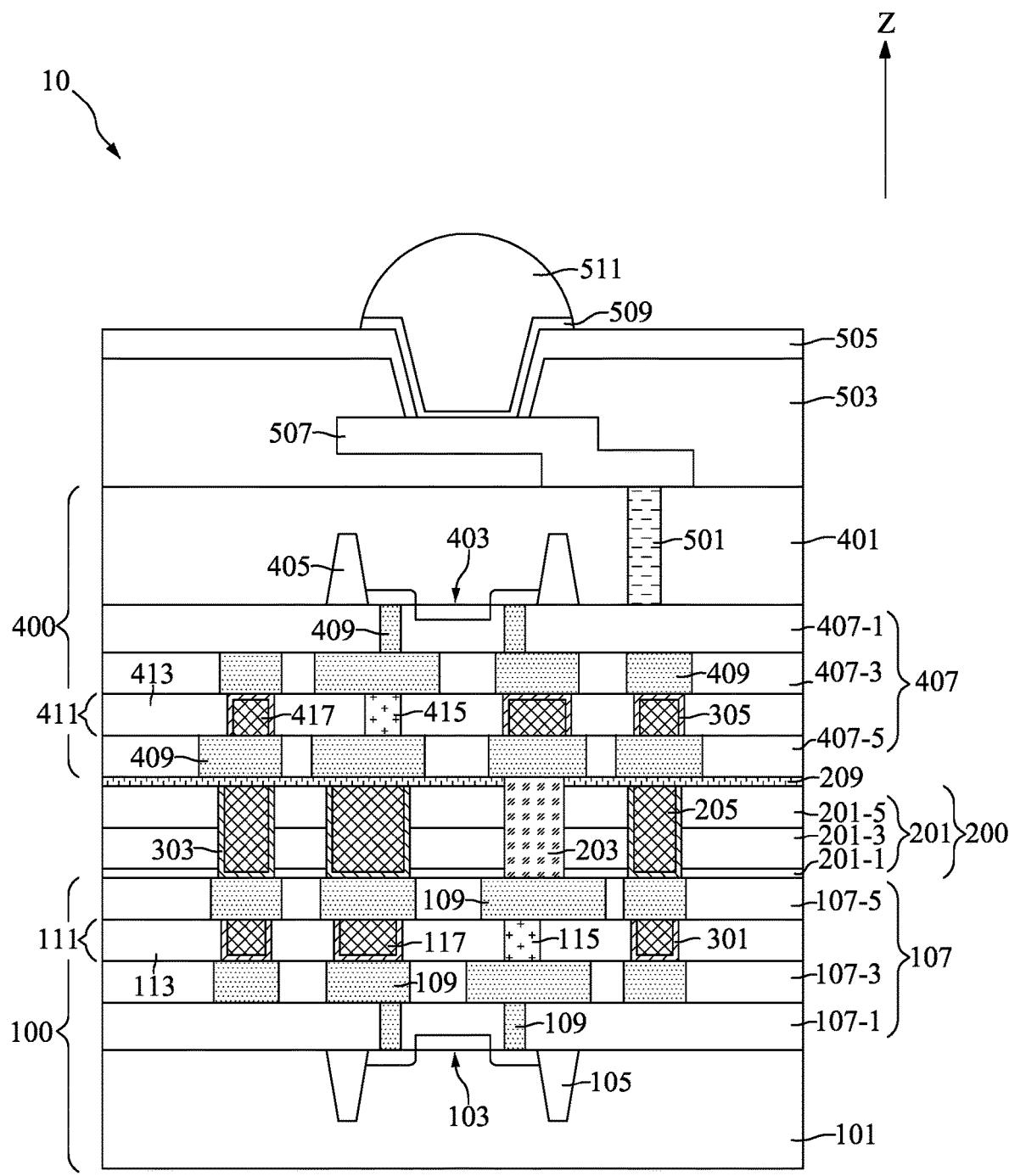

With reference to FIG. 37, a second semiconductor structure 400 may be bonded to the connection structure 200 through a bonding process. During the bonding process, the layer of third energy-removable material 617 may be thinned due to its porous characteristic. As a result, the top surface of the connection layer 203 may form a protrusion (indicated by a dashed oval in FIG. 37). The protrusion may prevent the metal-to-metal bonding from dielectrically intervening with the top insulating layer 201-5 or the fourth insulating layer 407-5. Therefore, a more reliable bonding between the second semiconductor structure 400 and the connection structure 200 may be achieved. With reference to FIG. 38, an energy treatment similar to that illustrated in FIG. 23 may be performed to turn the layer of third energy-removable material 617 into a second porous interlayer 209. A porosity of the second porous interlayer 209 may be between about 25% and about 50%. In some embodiments, the energy treatment may be performed before the bonding process. With reference to FIG. 39, other elements may be formed by a procedure similar to that illustrated in FIG. 26.

Due to the design of the semiconductor device of the present disclosure, the first semiconductor structure 100 and the second semiconductor structure 400 may be connected together through the connection structure 200 to provide more sophisticated functionality while occupying less volume. Therefore, the cost of the semiconductor device may be reduced, and the profitability of the semiconductor device may be increased. In addition, the plurality of first alleviation layers 117 and the plurality of first porous interlayers 205 may alleviate an interference effect between electrical signals induced in or applied to the first semiconductor structure 100 and the semiconductor device 10A.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first insulating layer positioned above the substrate;
a second insulating layer positioned above the first insulating layer;
a plurality of first conductive features positioned in the first insulating layer and the second insulating layer;
an alleviation structure positioned between the first insulating layer and the second insulating layer, wherein the alleviation structure comprises a first connecting interlayer respectively electrically coupled to the plurality of first conductive features positioned in the first insulating layer and the second insulating layer, and a plurality of alleviation layers positioned between the plurality of first conductive features in the first insulating layer and the plurality of first conductive features in the second insulating layer, wherein a porosity of the plurality of alleviation layers is between about 25% and about 100%;
a plurality of porous dielectric layers positioned on sidewalls and bottom surfaces of the plurality of alleviation layers; and
a plurality of top porous dielectric layers positioned between the plurality of alleviation layers and the plurality of first conductive features positioned in the second insulating layer.

2. The semiconductor device of claim 1, further comprising a connection structure positioned between a first semiconductor structure and a second semiconductor structure, wherein the connection structure comprises a connection layer electrically coupled to the plurality of first conductive features and the plurality of second conductive features, and a plurality of first porous interlayers positioned between the plurality of first conductive features and the plurality of second conductive features.

3. The semiconductor device of claim 2, wherein a porosity of the plurality of first porous interlayers is between about 25% and about 100%.

4. The semiconductor device of claim 3, further comprising a plurality of porous dielectric layers positioned on sidewalls and bottom surfaces of the plurality of first porous interlayers.

5. The semiconductor device of claim 4, wherein the connection structure comprises a connection insulating layer positioned between the first semiconductor structure and the connection structure, wherein the connection layer and the plurality of first porous interlayers are positioned in the connection insulating layer.

6. The semiconductor device of claim 5, wherein the connection insulating layer comprises a bottom insulating layer positioned on the top surface of the first semiconductor structure, a middle insulating layer positioned on the bottom insulating layer, and a top insulating layer positioned on the middle insulating layer.

7. The semiconductor device of claim 6, wherein the plurality of first porous interlayers are positioned so as to penetrate the bottom insulating layer, the middle insulating layer, and the top insulating layer.

8. The semiconductor device of claim 6, wherein the plurality of first porous interlayers have a thickness less than a thickness of the connection insulating layer.

9. The semiconductor device of claim 8, further comprising a second porous interlayer positioned between the top insulating layer and the second semiconductor structure, wherein a porosity of the second porous interlayer is less than the porosity of the plurality of first porous interlayers.

10. The semiconductor device of claim 9, wherein the porosity of the second porous interlayer is between about 25% and about 50%.

11. The semiconductor device of claim 8, wherein the plurality of first porous interlayers have widths less than widths of the plurality of second conductive features.

12. The semiconductor device of claim 11, wherein widths of the plurality of first conductive features are greater than the widths of the plurality of first porous interlayers.

13. The semiconductor device of claim 2, wherein the connection structure comprises a plurality of assistance layers positioned in the connection insulating layer, and the second semiconductor structure comprises a plurality of guard rings positioned on the plurality of assistance layers.

14. The method for fabricating the semiconductor device of claim 13, wherein the step of forming an alleviation structure between the first insulating layer and the second insulating layer comprises:
forming a connection insulating layer on the substrate;
forming a plurality of openings in the connection layer;
forming a layer of energy-removable material in the plurality of openings;
performing a planarization process until a top surface of the connection insulating layer is exposed; and
performing an energy treatment to turn the layer of energy-removable material into the plurality of first porous interlayers.

15. A method for fabricating a semiconductor device, comprising:
providing a substrate;
forming a first insulating layer with a plurality of first conductive features above the substrate;
forming an alleviation structure on the first insulating layer;
forming a second insulating layer with a plurality of first conductive features above the alleviation structure; and
wherein the alleviation structure comprises a first connecting interlayer respectively electrically coupled to the plurality of first conductive features positioned in the first insulating layer and the second insulating layer, and a plurality of alleviation layers positioned between the plurality of first conductive features in the first insulating layer and the plurality of first conductive features in the second insulating layer, wherein a porosity of the plurality of alleviation layers is between about 25% and about 100%.

16. The method for fabricating the semiconductor device of claim 15, further comprising: forming a plurality of porous dielectric layers on sidewalls and bottom surfaces of the plurality of alleviation layers.

17. The method for fabricating the semiconductor device of claim 16, further comprising: forming a plurality of top porous dielectric layers positioned between the plurality of alleviation layers and the plurality of first conductive features positioned in the second insulating layer.

18. The method for fabricating the semiconductor device of claim 15, wherein the layer of energy-removable material comprises a base material and a decomposable porogen material, the base material comprises methylsilsesquioxane, low-dielectric materials, or silicon oxide.

* * * * *